(12) United States Patent
Shen et al.

(10) Patent No.: US 12,727,101 B2
(45) Date of Patent: Sep. 1, 2026

(54) HINGE MECHANISM AND ELECTRONIC DEVICE

(71) Applicant: Huawei Technologies Co., Ltd., Shenzhen (CN)

(72) Inventors: Hewen Shen, Dongguan (CN); Yuanhan Yuan, Dongguan (CN); Ding Zhong, Dongguan (CN); Lei Yu, Dongguan (CN); Li Liao, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 116 days.

(21) Appl. No.: 18/856,806

(22) PCT Filed: Sep. 19, 2023

(86) PCT No.: PCT/CN2023/119681
§ 371 (c)(1),
(2) Date: Oct. 14, 2024

(87) PCT Pub. No.: WO2024/159757
PCT Pub. Date: Aug. 8, 2024

(65) Prior Publication Data

US 2025/0275073 A1 Aug. 28, 2025

(30) Foreign Application Priority Data

Jan. 31, 2023 (CN) ........................ 202310117432.X

(51) Int. Cl.
*H05K 5/02* (2006.01)
*G06F 1/16* (2006.01)

(52) U.S. Cl.
CPC ............ *H05K 5/0226* (2013.01); *G06F 1/16* (2013.01)

(58) Field of Classification Search
CPC ........ G06F 1/16; G06F 1/1616; G06F 1/1652; G06F 1/1681; G06F 9/30; G06F 9/301; H05K 5/0226; F16C 11/04
See application file for complete search history.

(56) References Cited

U.S. PATENT DOCUMENTS

2021/0119171 A1* 4/2021 Kim ...................... G06F 1/1616
2021/0181808 A1* 6/2021 Liao .................... H04M 1/0216
(Continued)

FOREIGN PATENT DOCUMENTS

CN 105530340 A 4/2016
CN 110958337 A 4/2020
(Continued)

*Primary Examiner* — Abhishek M Rathod
(74) *Attorney, Agent, or Firm* — Conley Rose, P.C.

(57) ABSTRACT

A hinge mechanism includes a base and a main shaft module, where the main shaft module includes two rotation assemblies, and the two rotation assemblies are located on two sides of the base. Each rotation assembly includes a support plate, a swing arm, a support arm, and a housing fastening bracket. The support plate has two guiding parts, and each guiding part has a groove. Both the support arm and the swing arm are rotatably connected to the base. The support arm and the swing arm each have a guiding structure, and the two guiding structures each are correspondingly inserted into a groove. When the two housing fastening brackets rotate toward each other, the support arm and the swing arm on a corresponding side may be driven to rotate around the base, and the support plate on the corresponding side is driven to rotate relative to the housing fastening bracket.

18 Claims, 10 Drawing Sheets

(56) References Cited

U.S. PATENT DOCUMENTS

| | | | | |
|---|---|---|---|---|
| 2021/0271294 | A1* | 9/2021 | Liao | G06F 1/181 |
| 2021/0368032 | A1* | 11/2021 | Liao | G06F 1/1681 |
| 2022/0104370 | A1* | 3/2022 | Wu | G06F 1/1681 |
| 2022/0303371 | A1* | 9/2022 | Liao | H04M 1/0216 |

FOREIGN PATENT DOCUMENTS

| | | | |
|---|---|---|---|
| CN | 111614806 | A | 9/2020 |
| CN | 113194183 | A | 7/2021 |
| CN | 115480617 | A | 12/2022 |
| CN | 115480618 | A | 12/2022 |
| CN | 219953941 | U | 11/2023 |

* cited by examiner

HINGE MECHANISM AND ELECTRONIC DEVICE

CROSS-REFERENCE TO RELATED APPLICATIONS

This is a National Stage of International Patent Application No. PCT/CN2023/119681 filed on Sep. 19, 2023, which claims priority to Chinese Patent Application No. 202310117432.X filed on Jan. 31, 2023. The disclosures of the aforementioned applications are hereby incorporated by reference in their entireties.

TECHNICAL FIELD

This application relates to the field of electronic device technologies, and in particular, to a hinge mechanism and an electronic device.

BACKGROUND

Gradual maturity of flexible display technologies brings great changes to display of an electronic device. Foldable mobile phones, tablet computers, or wearable electronic devices with flexible displays, are an important trend of evolutions for intelligent electronic devices in the future.

A key component of a foldable electronic device is a flexible display featured by continuousness and foldability. A hinge mechanism, as an important component for folding the foldable electronic device, uses a support plate of the hinge mechanism to form display accommodation space to accommodate a bendable part of the flexible display when the foldable electronic device is in a folded state, and uses the support plate of the hinge mechanism to flatly support the bendable part of the flexible display when the foldable electronic device is in an unfolded state.

In view of this, in a process of unfolding or folding the hinge mechanism, how to move the support plate is a key to prevent the support plate from pulling or squeezing the flexible display. Therefore, how to drive the support plate to move has become an urgent problem to be resolved by a person skilled in the art.

SUMMARY

This application provides a hinge mechanism and an electronic device, so that when the electronic device is in a folded state, the hinge mechanism can form display accommodation space used to accommodate a bendable part of a flexible display, and when the electronic device is in an unfolded state, the hinge mechanism can flatly support the bendable part of the flexible display.

According to a first aspect, this application provides a hinge mechanism, and the hinge mechanism may be used in a foldable electronic device, where the hinge mechanism is disposed in correspondence with a bendable part of a flexible display of the electronic device, and the electronic device is unfolded or folded by using the hinge mechanism. The hinge mechanism may be set to include a base and a main shaft module. The base includes a bearing surface, and the bearing surface is configured to support the flexible display. The main shaft module includes a first rotation assembly and a second rotation assembly, and the first rotation assembly and the second rotation assembly are disposed on two opposite sides of the base. The first rotation assembly includes a first support plate, a first swing arm, a first support arm, and a first housing fastening bracket, the first support plate is rotatably connected to the first housing fastening bracket, the first support plate includes a first plate surface, and the first plate surface is configured to support the flexible display. In addition, the first support plate further includes a first guiding part and a second guiding part. The first guiding part has a first track groove, and the second guiding part has a second track groove. The first support arm is rotatably connected to the base, the first support arm is slidably connected to the first housing fastening bracket, the first support arm may be provided with a first guiding structure, and the first guiding structure is inserted into the first track groove and is capable of sliding along the first track groove. The first swing arm is rotatably connected to the base, a rotation axis of the first support arm and a rotation axis of the first swing arm are parallel and do not coincide, the first swing arm is provided with a second guiding structure, and the second guiding structure is inserted into the second track groove and is capable of sliding along the second track groove.

The second rotation assembly includes a second support plate, a second support arm, a second swing arm, and a second housing fastening bracket, the second support plate is rotatably connected to the second housing fastening bracket, the second support plate includes a second plate surface, and the second plate surface is configured to support the flexible display. In addition, the second support plate further includes a third guiding part and a fourth guiding part. The third guiding part has a third track groove, and the fourth guiding part has a fourth track groove. The second support arm is rotatably connected to the base, the second support arm is slidably connected to the second housing fastening bracket, the second support arm may be provided with a third guiding structure, and the third guiding structure is inserted into the third track groove and is capable of sliding along the third track groove. The second swing arm is provided with a fourth guiding structure, and the fourth guiding structure is inserted into the fourth track groove and is capable of sliding along the fourth track groove.

By using the hinge mechanism provided in this application, when the first housing fastening bracket and the second housing fastening bracket rotate toward each other, the first housing fastening bracket can drive the first support arm and the first swing arm to rotate around the base, the first guiding structure can slide along the first track groove, the second guiding structure can slide along the second track groove, and the first support arm and the first swing arm drive the first housing support plate to rotate relative to the first housing fastening bracket, and drive an end that is of the first support plate and that is close to the base to move in a direction away from the base. The second housing fastening bracket drives the second support arm and the second swing arm to rotate around the base, the third guiding structure is capable of sliding along the third track groove, the fourth guiding structure is capable of sliding along the fourth track groove, and the second support arm and the second swing arm drive the second support plate to rotate relative to the second housing fastening bracket, and drive an end that is of the second support plate and that is close to the base to move in a direction away from the base, so as to form, between the first plate surface, the second plate surface, and the bearing surface, display accommodation space used to accommodate a bendable part of the flexible display. In addition, when the electronic device is in an unfolded state, the first plate surface, the second plate surface, and the bearing surface may jointly flatly support the bendable part of the flexible display. In this way, in a rotation process of the hinge mechanism, squeezing or pulling on the flexible display can be effectively avoided, thereby reducing a risk of damage to the flexible display, and prolonging a service life of the flexible display.

In addition, the support arm and the swing arm jointly drive the support plate to rotate relative to the housing fastening bracket, so that precision of a rotation angle of the support plate can be effectively improved. In addition, when the electronic device falls, the support arm and the swing arm jointly support the support plate, so that state stability of the support plate can be improved. This can further reduce squeezing or pulling by the support plate on the flexible display, to reduce a risk of damage to the flexible display.

In a possible implementation of this application, the first track groove may be set to have a first opening, and the first opening may be disposed in a direction away from the base. In addition, the first guiding structure may have a first guiding surface, the first guiding surface may be but is not limited to a circular-arc-shaped surface, an elliptical surface, an oblique surface, or the like, and the first guiding surface is capable of sliding along a groove wall of the first track groove, to drive the first support plate to rotate around the first housing fastening bracket. Similarly, the third track groove may have a second opening, and the second opening may be disposed in a direction away from the base. In addition, the third guiding structure may have a third guiding surface, the third guiding surface may be but is not limited to a circular-arc-shaped surface, an elliptical surface, an oblique surface, or the like, and the third guiding surface is capable of sliding along a groove wall of the third track groove, to drive the second support plate to rotate around the second housing fastening bracket. The first track groove and the third track groove are set as the foregoing open grooves, so that space occupied by the first guiding part and the second guiding part can be effectively reduced, and more disposing space can be reserved for another structure in the hinge mechanism. For example, thicknesses of the first housing fastening bracket and the second housing fastening bracket may be increased, to improve mechanism reliability of the hinge mechanism.

When the first track groove is an open groove, the second track groove may be set as a closed groove. In this case, the second guiding structure may be used as a guiding shaft. In this way, connections between the first support plate, and the first support arm and the first swing arm are reliable, to improve motion reliability of the first support plate. Similarly, when the third track groove is an open groove, the fourth track groove may be set as a closed groove. In this case, the fourth guiding structure may be used as a guiding shaft. In this way, connections between the second support plate, and the second support arm and the second swing arm are reliable, to improve motion reliability of the second support plate.

In a possible implementation of this application, specifically, when the first support arm and the first support plate are fit together, the first support arm may have a first hollow zone. In this way, at least a part of the first guiding part of the first support plate can be inserted into the first hollow zone, so that the first support arm and the first support plate are fit compactly. Similarly, the second support arm may have a third hollow zone, and at least a part of the third guiding part of the second support plate can be inserted into the third hollow zone, so that the second support arm and the second support plate are fit compactly. This helps implement a miniaturization design of the hinge mechanism.

In addition, when the first swing arm and the first support plate are fit together, the first swing arm may have a second hollow zone. In this way, at least a part of the second guiding part of the first support plate can be inserted into the second hollow zone, so that the first swing arm and the first support plate are fit compactly. Similarly, the second swing arm may have a fourth hollow zone, and at least a part of the fourth guiding part of the second support plate can be inserted into the fourth hollow zone, so that the second swing arm and the second support plate are fit compactly. This helps implement a miniaturization design of the hinge mechanism.

In this application, the first support plate may further include a third plate surface, and the first plate surface is disposed back to back with the third plate surface. In this way, the first guiding part and the second guiding part can be disposed on the third plate surface, so that while the first plate surface of the first support plate flatly supports the flexible display, the first support plate can be connected to the first support arm and the first swing arm by using the first guiding part and the second guiding part that are disposed on the third plate surface. Similarly, the second support plate may further include a fourth plate surface, and the second plate surface is disposed back to back with the fourth plate surface. In this way, the third guiding part and the fourth guiding part can be disposed on the fourth plate surface, so that while the second plate surface of the second support plate flatly supports the flexible display, the second support plate can be connected to the second support arm and the second swing arm by using the third guiding part and the fourth guiding part that are disposed on the fourth plate surface.

Based on a specific design of the first support plate, in a possible implementation of this application, the second track groove may be designed as a straight groove, and when the hinge mechanism is in the unfolded state, in a direction from the first plate surface to the third plate surface, the second track groove may extend in a direction away from the base, thereby simplifying a design of the second track groove. Similarly, based on a specific design of the second support plate, the fourth track groove may also be designed as a straight groove, and when the hinge mechanism is in the unfolded state, in a direction from the second plate surface to the fourth plate surface, the fourth track groove may extend in a direction away from the base, thereby simplifying a design of the fourth track groove.

To enable the first support plate to rotate relative to the first housing fastening bracket, in a possible implementation of this application, the first housing fastening bracket may be provided with a first rotation groove, and the first support plate may be provided with a first rotation part. In this way, the first rotation part may be disposed in the first rotation groove, so that the first rotation part is capable of rotating along a groove surface of the first rotation groove, to implement rotation of the first support plate around the first housing fastening bracket. Similarly, the second housing fastening bracket may be provided with a second rotation groove, and the second support plate may be provided with a second rotation part. In this way, the second rotation part may be disposed in the second rotation groove, and the second rotation part is capable of rotating along a groove surface of the second rotation groove, to implement rotation of the second support plate around the second housing fastening bracket.

In addition, in another possible implementation of this application, the first support plate may alternatively be rotatably connected to the first housing fastening bracket by using a first pin, so that structures of the first support plate and the first housing fastener can be effectively simplified, thereby simplifying a structure of the hinge mechanism. Similarly, the second support plate may be rotatably connected to the second housing fastening bracket by using a second pin, so that structures of the second support plate and the second housing fastener are simplified, thereby simplifying a structure of the hinge mechanism.

In this application, to implement rotatable connections between the first swing arm and the base and between the second swing arm and the base, in a possible implementation, the base may be provided with a first arc-shaped groove and a second arc-shaped groove. In addition, an end that is of the first swing arm and that is used to rotatably connect to the base is provided with a first arc-shaped rotation block, and the first arc-shaped rotation block is accommodated in the first arc-shaped groove and is capable of rotating along an arc-shaped surface of the first arc-shaped groove. An end that is of the second swing arm and that is used to rotatably connect to the base is provided with a second arc-shaped rotation block, and the second arc-shaped rotation block is accommodated in the second arc-shaped groove and is capable of rotating along an arc-shaped surface of the second arc-shaped groove. The first swing arm and the second swing arm are rotatably connected to the base in a manner of a virtual shaft, so that space occupied by the first swing arm and the second swing arm can be effectively reduced. This helps implement miniaturization of the hinge mechanism.

In a possible implementation of this application, the first swing arm is rotatably connected to the first housing fastening bracket, and the second swing arm is rotatably connected to the second housing fastening bracket. This can effectively simplify a connection manner between the first swing arm and the first housing fastening bracket and a connection manner between the second swing arm and the second housing fastening bracket, thereby simplifying a structure of the hinge mechanism.

According to a second aspect, this application further provides an electronic device. The electronic device includes a first housing, a second housing, a flexible display, and the hinge mechanism according to the first aspect. The first housing and the second housing are separately disposed on two opposite sides of the hinge mechanism, a first housing fastening bracket is fastened to the first housing, and a second housing fastening bracket is fastened to the second housing. In addition, the flexible display may continuously cover the first housing, the second housing, and the hinge mechanism, and the flexible display is fastened to the first housing and the second housing.

In the electronic device provided in this application, when the electronic device is in an unfolded state, two support plates of the hinge mechanism can flatly support the flexible display. This can ensure that a form of the electronic device in the unfolded state is complete.

In addition, when the electronic device is in a folded state, display accommodation space can be formed between a first support plate, a second support plate, and a base in the hinge mechanism, so that a bendable part of the flexible display that is accommodated in the display accommodation space can be in a water drop shape, thereby reducing a risk of damage to the flexible display, and prolonging a service life of the flexible display.

In a possible implementation of this application, the flexible display may be bonded to a first plate surface of the first support plate and a second plate surface of the second support plate. Specifically, the flexible display may be bonded to a partial area of the first plate surface, and the flexible display may be bonded to a partial area of the second plate surface. Therefore, when the electronic device is in the unfolded state, the first housing, the second housing, the first support plate, and the second support plate can all flatly support the flexible display. In a process in which the electronic device changes from the unfolded state to the folded state, the two support plates can drive the flexible display to rotate. This can effectively avoid deformation of the flexible display, and reduce a risk of damage to the flexible display. In addition, when the electronic device is in the folded state, the flexible display can be attached to the two support plates. This can help improve light and shadow of the flexible display.

REFERENCE NUMERALS

Figure 1:
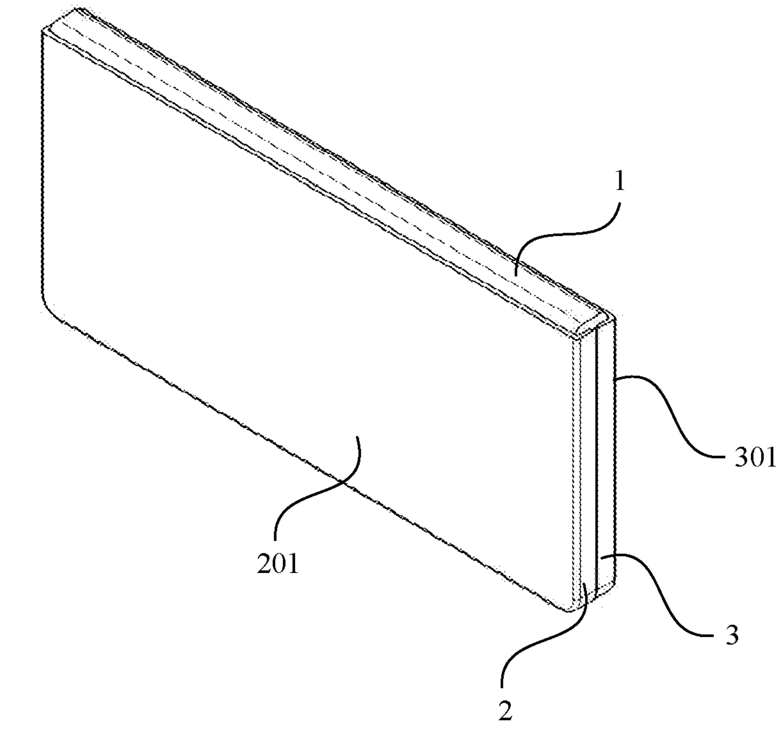
FIG. 1 is a diagram of a structure of an electronic device in a folded state according to an embodiment of this application.

1: hinge mechanism; 101: main shaft module; 1011: first rotation assembly; 10111: first support plate; 101111: first plate surface;

101112: third plate surface; 101113: first rotation part; 101114: first guiding part; 1011141: first track groove;
10111411: first opening; 101115: second guiding part; 1011151: second track groove;
10112: first support arm; 101121: first guiding structure; 1011211: first guiding surface; 101122: first hollow zone;
10113: first swing arm; 101131: first arc-shaped rotation block; 101132: second guiding structure; 101133: second hollow zone;
10114: first housing fastening bracket; 101141: first sliding groove; 101142: first installation part;
101143: first rotation groove;
1012: second rotation assembly; 10121: second support plate; 101211: second plate surface; 101212: fourth plate surface;
101213: second rotation part; 101214: third guiding part; 1012141: third track groove; 10121411: second opening;
101215: fourth guiding part; 1012151: fourth track groove; 10122: second support arm; 101221: third guiding structure;
1012211: second guiding surface; 10123: second swing arm; 101231: second arc-shaped rotation block; 101232: fourth guiding structure;
10124: second housing fastening bracket; 101241: third sliding groove; 101242: second installation part; 101243: second rotation groove;
102: base; 1021: bearing surface; 1022: first arc-shaped groove; 1023: second arc-shaped groove;
103: display accommodation space;
2: first housing; 201: first appearance surface; 202: first support surface;
3: second housing; 301: second appearance surface; 302: second support surface; and
4: flexible display.

DESCRIPTION OF EMBODIMENTS

To make the objectives, technical solutions, and advantages of this application clearer, the following further describes this application in detail with reference to the accompanying drawings. Terms used in the following embodiments are merely intended to describe specific embodiments, but are not intended to limit this application. The terms “one”, “a”, “the”, “the foregoing”, “this”, and “this one” of singular forms used in this specification and the appended claims of this application are also intended to include expressions such as “one or more”, unless otherwise specified in the context clearly.

Reference to “an embodiment”, “some embodiments”, or the like described in this specification indicates that one or more embodiments of this application include a specific feature, structure, or characteristic described with reference to embodiments. Therefore, statements such as “in an embodiment”, “in some embodiments”, “in some other embodiments”, and “in other embodiments” that appear at different places in this specification do not necessarily mean referring to a same embodiment. Instead, the statements mean “one or more but not all of embodiments”, unless otherwise specifically emphasized in another manner. The terms “include”, “comprise”, “have”, and their variants all mean “include but are not limited to”, unless otherwise specifically emphasized in another manner.

For ease of understanding a hinge mechanism provided in embodiments of this application, the following first describes an application scenario of the hinge mechanism. The hinge mechanism is used in, but is not limited to, a foldable electronic device like a mobile phone, a palmtop computer (personal digital assistant, PDA), a notebook computer, or a tablet computer. When the hinge mechanism provided in embodiments of this application is used in an electronic device, refer to FIG. 1. FIG. 1 is a diagram of a structure of an electronic device according to an embodiment of this application. In addition to a hinge mechanism 1, the electronic device may further include two housings and a flexible display 4. For ease of description, the two housings may be respectively named as a first housing 2 and a second housing 3. The first housing 2 and the second housing 3 are located on two sides of the hinge mechanism 1, and can rotate around the hinge mechanism 1. When the electronic device is used, the electronic device may be folded and unfolded in different use scenarios. The electronic device provided in this application may be an inward-folded electronic device. In the embodiment shown in FIG. 1, the electronic device is in a folded state, and FIG. 1 shows a relative position relationship between the hinge mechanism 1 and the two housings in the electronic device in the folded state. In this case, a surface of the hinge mechanism 1, a first surface of the first housing 2, and a first surface of the second housing 3 may be jointly used as an appearance surface of the electronic device. The first surface of the first housing 2 is a surface that is of the first housing 2 and that is away from the flexible display 4, and the first surface of the second housing 3 is a surface that is of the second housing 3 and that is away from the flexible display 4. Therefore, in the following embodiments, the first surface of the first housing 2 is denoted as a first appearance surface 201, and the first surface of the second housing 3 is denoted as a second appearance surface 301.

Figure 2:
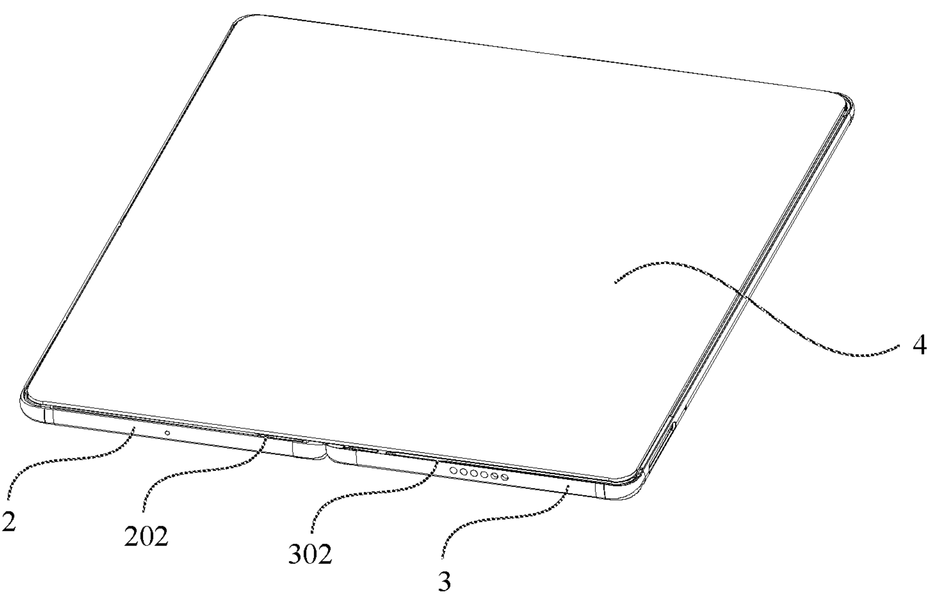
FIG. 2 is a diagram of a structure of an electronic device in an unfolded state according to an embodiment of this application.

In addition, refer to FIG. 2. FIG. 2 is a diagram of the structure of the electronic device in the unfolded state. It should be noted that FIG. 2 shows a structure of a side of a second surface of the first housing 2 and a second surface of the second housing 3. The second surface of the first housing 2 is a surface that is of the first housing 2 and that is configured to support the flexible display 4, and the second surface of the second housing 3 is a surface that is of the second housing 3 and that is configured to support the flexible display 4. Therefore, in the following embodiments, the second surface of the first housing 2 is denoted as a first support surface 202, and the second surface of the second housing 3 is denoted as a second support surface 302.

The flexible display 4 may continuously cover the first support surface 202 of the first housing 2, the second support surface 302 of the second housing 3, and the hinge mechanism 1 (not shown in FIG. 2, and reference may be made to FIG. 1). The hinge mechanism 1 is disposed in correspondence with a bendable part of the flexible display 4. In addition, the flexible display 4 may be fastened to the first support surface 202 of the first housing 2 and the second support surface 302 of the second housing 3, and a connection manner may be but is not limited to bonding. In this way, when the electronic device is in the unfolded state shown in FIG. 2, the hinge mechanism 1, the first housing 2, and the second housing 3 can support the flexible display 4.

In a process in which the first housing 2 and the second housing 3 rotate relatively from the unfolded state shown in FIG. 2 to the folded state shown in FIG. 1, or from the folded state shown in FIG. 1 to the unfolded state shown in FIG. 2, the flexible display 4 may be bent or flattened with the first housing 2 and the second housing 3.

It may be understood that a process of the electronic device from the unfolded state shown in FIG. 2 to the folded state shown in FIG. 1, or from the folded state shown in FIG. 1 to the unfolded state shown in FIG. 2 is the process in which the first housing 2 and the second housing 3 rotate around the hinge mechanism 1. As a key functional component in the foldable electronic device, the hinge mechanism 1 may be disposed in correspondence with a foldable part of the flexible display 4. Therefore, the hinge mechanism 1 is important in supporting the foldable part of the flexible display 4 in the unfolded state shown in FIG. 2 and in accommodating the foldable part of the flexible display 4 in the folded state shown in FIG. 1.

For example, when the electronic device is in the folded state shown in FIG. 1, if space formed between the first housing 2, the hinge mechanism 1, and the second housing 3 cannot meet a bending requirement of the flexible display 4, the flexible display 4 may be squeezed or pulled. As a result, after the electronic device performs a plurality of folding operations, the flexible display 4 is easily damaged.

A current hinge mechanism 1 may be set to include a base 102 and two rotation assemblies, and each rotation assembly may include a support arm, a swing arm, a housing fastening bracket, and a support plate. When the housing fastening brackets of the two rotation assemblies move toward each other, the support arm and the swing arm on a corresponding side may be driven to rotate around the base 102, and each support plate may be enabled to rotate around the housing fastening bracket on the corresponding side, so that display accommodation space used to accommodate the flexible display 4 may be formed between the two support plates. It can be learned that a form of the display accommodation space formed by the hinge mechanism 1 is related to motion of the two support plates. Based on this, if display accommodation space that meets a bending requirement of the flexible display 4 needs to be formed, an implementation of rotating of the support plate around the housing fastening bracket on the corresponding side is a difficulty.

The hinge mechanism provided in this application is intended to resolve the foregoing problem. By properly designing a manner of driving the support plate to move, when the electronic device is in the folded state, display accommodation space that meets a bending requirement of the flexible display can be formed between two support plates; and when the electronic device is in the unfolded state, the support plate can stably support a bendable part of the flexible display. In this way, deformation of the flexible display can be avoided, and squeezing or pulling stress on the flexible display can be reduced, so as to prolong a service life of the flexible display, improve reliability of the electronic device, and improve user experience. To facilitate understanding of the hinge mechanism provided in embodiments of this application, the following describes a specific structure of the hinge mechanism in detail with reference to the accompanying drawings.

Figure 3:
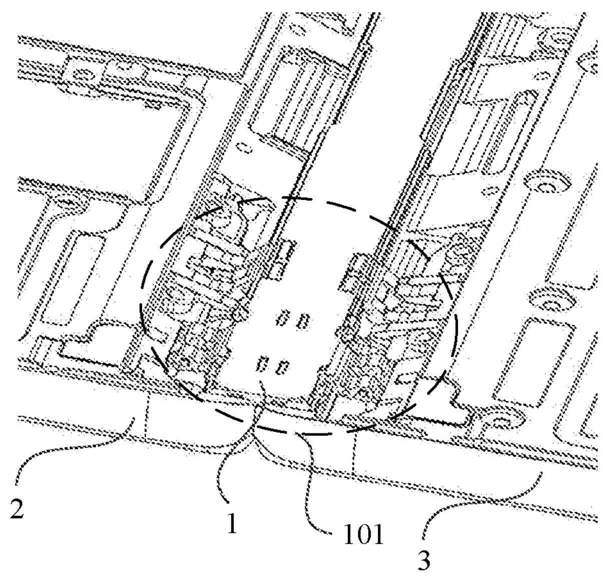
FIG. 3 is a diagram of a partial structure of the electronic device shown in FIG. 2.

Refer to FIG. 3. FIG. 3 is a diagram of a partial structure of the electronic device shown in FIG. 2. The flexible display 4 is omitted in FIG. 3. In addition, it can be seen from FIG. 3 that the first housing 2 and the second housing 3 are located on two opposite sides of the hinge mechanism 1. In this application, the hinge mechanism 1 may include one main shaft module 101, or may include a plurality of main shaft modules 101. FIG. 3 shows only one main shaft module 101 of the hinge mechanism 1. When the hinge mechanism 1 includes a plurality of main shaft modules 101, the plurality of main shaft modules 101 may be arranged at intervals in a length direction of the hinge mechanism 1. In this application, the length direction of the hinge mechanism 1 is an extension direction of an axis of rotation of the first housing 2 and the second housing 3 around the hinge mechanism 1. The first housing 2 and the second housing 3 may be rotatably connected through the plurality of main shaft modules 101. This can effectively improve stability of rotation of the first housing 2 and the second housing 3 of the electronic device relative to the hinge mechanism 1.

Figure 4:
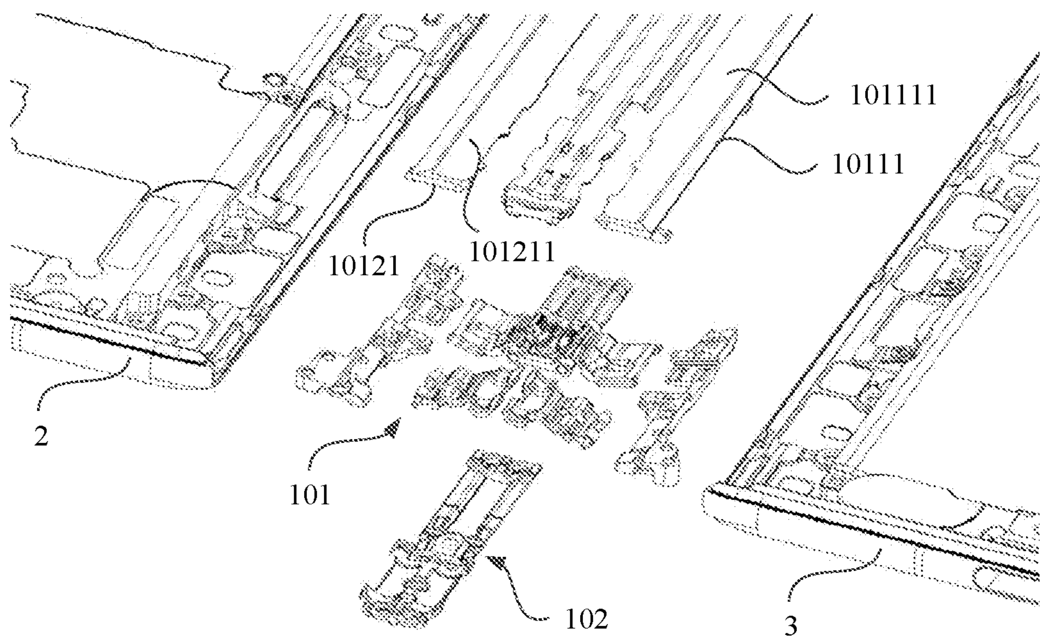
FIG. 4 is an exploded view of a partial structure of the electronic device shown in FIG. 3.

In addition, refer to FIG. 4. FIG. 4 is an exploded view of the structure shown in FIG. 3. The hinge mechanism 1 may further include a base 102. The main shaft module 101 may include a first rotation assembly 1011 and a second rotation assembly 1012, and the base 102 may serve as a bearing component of the first rotation assembly 1011 and the second rotation assembly 1012. The first rotation assembly 1011 and the second rotation assembly 1012 are separately disposed on two opposite sides of the base 102, and are rotatably connected to the base 102 separately.

It should be noted that, in a possible embodiment of this application, when there are a plurality of main shaft modules 101, the first rotation assemblies 1011 and the second rotation assemblies 1012 of the plurality of main shaft modules 101 may all use one same base 102 as the bearing component. This improves an integration degree of the hinge mechanism 1. In some other possible embodiments of this application, in the hinge mechanism 1, one base 102 may be correspondingly disposed for each main shaft module 101, so that the first rotation assembly 1011 and the second rotation assembly 1012 of each main shaft module 101 use the corresponding base 102 as the bearing component.

Still refer to FIG. 4. The first rotation assembly 1011 may include a first support plate 10111. In addition, the second rotation assembly 1012 may include a second support plate 10121. The first support plate 10111 includes a first surface and a second surface that are disposed back to back with each other, and the second support plate 10121 includes a first surface and a second surface that are disposed back to back with each other. The first surface of the first support plate 10111 and the first surface of the second support plate 10121 may be used to support the flexible display 4. In embodiments of this application, the first surface of the first support plate 10111 may be denoted as a first plate surface 101111, and the first surface of the second support plate 10121 may be denoted as a second plate surface 101211.

Figure 5:
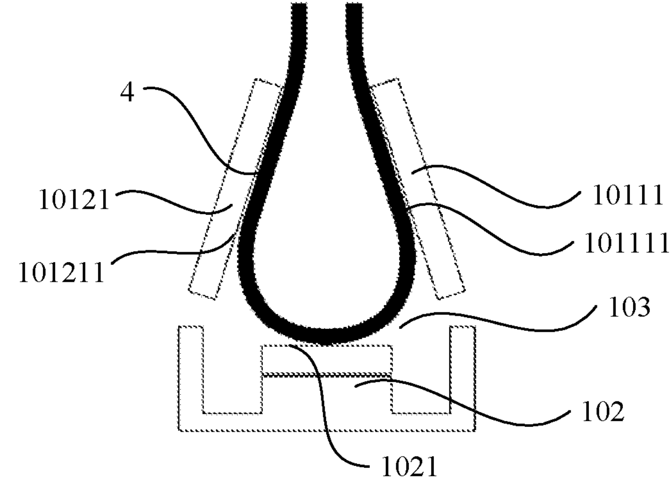
FIG. 5 is a block diagram of a structure of a hinge mechanism in a folded state shown in FIG. 3.

Refer to FIG. 5. FIG. 5 is a block diagram of a structure of the hinge mechanism 1 in the folded state shown in FIG. 3. It can be seen from FIG. 5 that, in the hinge mechanism 1 provided in this application, the base 102 may include a bearing surface 1021 configured to support the flexible display 4. In addition, triangular display accommodation space 103 may be formed between the first plate surface 101111, the second plate surface 101211, and the bearing surface 1021. The bendable part of the flexible display 4 of the electronic device can be accommodated in the display accommodation space 103, to form a water-drop-like form.

Figure 6:
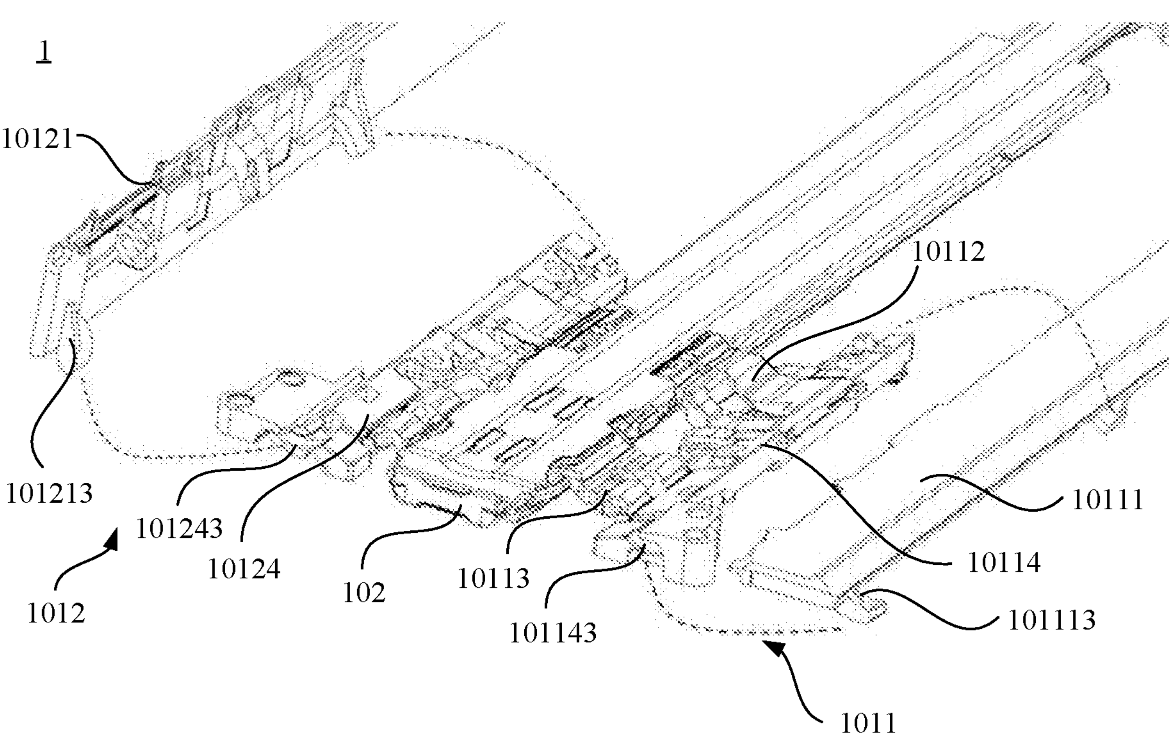
FIG. 6 is a diagram of a partial structure of a hinge mechanism according to an embodiment of this application.

In this application, refer to FIG. 6 about how to set the main shaft module 101 for the hinge mechanism 1 to form the display accommodation space 103 shown in FIG. 5. FIG. 6 is a diagram of a partial structure of the hinge mechanism 1 according to a possible embodiment of this application. The first rotation assembly 1011 may further include a first support arm 10112, and the first support arm 10112 may be rotatably connected to the base 102. For example, the first support arm 10112 may be rotatably connected to the base 102 through a pin.

It should be noted that, in this application, the first support arm 10112 may be rotatably connected to the base 102 through the pin. In addition, in some possible embodiments, the first support arm 10112 may alternatively be connected to the base 102 in a manner of a virtual shaft. The virtual shaft is an axis center of a circular-arc-shaped structure. Two components that are rotatably connected can rotate relative to the virtual shaft, and a position of the virtual shaft is fixed as the two components that are rotatably connected rotate relative to each other. For example, the base 102 may be provided with an arc-shaped groove, and the first support arm 10112 is provided with an arc-shaped rotation block, so that the arc-shaped rotation block slides along a groove surface of the arc-shaped groove, to implement rotation of the first support arm 10112 around the base 102.

Figure 7:
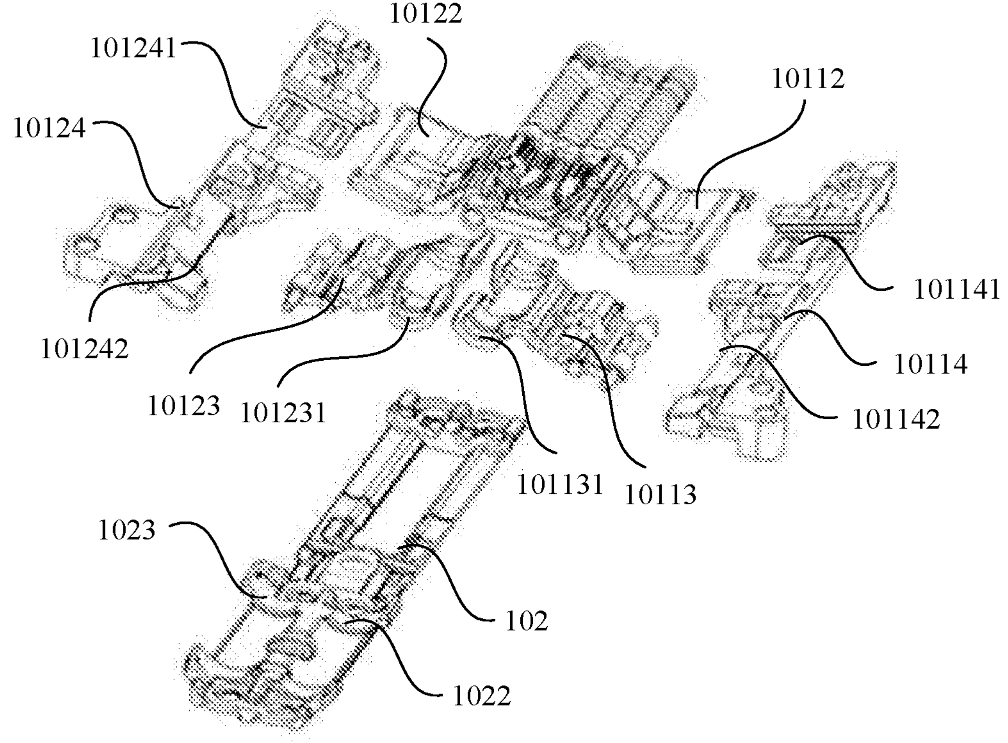
FIG. 7 is an exploded view of a partial structure of a hinge mechanism according to an embodiment of this application.

In this application, the first rotation assembly 1011 may further include a first swing arm 10113. The first swing arm 10113 is rotatably connected to the base 102. In a possible embodiment of this application, the first swing arm 10113 may be rotatably connected to the base 102 in a manner of a virtual shaft. This can help reduce space occupied by the first swing arm 10113 on the base 102, help reduce a volume of the main shaft module 101, and implement a miniaturization design of the hinge mechanism 1. In practice, refer to FIG. 7. FIG. 7 is an exploded view of a partial structure of the hinge mechanism 1 according to a possible embodiment of this application. An end that is of the first swing arm 10113 and that is used to connect to the base 102 may be provided with a first arc-shaped rotation block 101131. In addition, the base 102 may be provided with a first arc-shaped groove 1022. In this case, the first arc-shaped rotation block 101131 of the first swing arm 10113 may be accommodated in the first arc-shaped groove 1022, and may slide along an arc-shaped surface of the first arc-shaped groove 1022, to implement rotation of the first swing arm 10113 around the base 102. The first swing arm 10113 is rotatably connected to the base 102 in the manner of the virtual shaft. This can help reduce the space occupied by the first swing arm 10113 on the base 102, help reduce the volume of the main shaft module 101, and implement the miniaturization design of the hinge mechanism 1. It should be noted that in this application, the first arc-shaped rotation block 101131 may be but is not limited to a circular-arc-shaped rotation block, and the first arc-shaped groove 1022 may be but is not limited to a circular-arc-shaped groove.

In some other embodiments of this application, the first swing arm 10113 may be rotatably connected to the base 102 in a manner of a physical shaft. For example, the first swing arm 10113 may be rotatably connected to the base 102 through a pin. In this way, when the hinge mechanism 1 includes a plurality of main shaft modules 101, a first swing arm 10113 of at least one main shaft module 101 of the plurality of main shaft modules 101 may be rotatably connected to the base 102 in a manner of a virtual shaft, and a first swing arm 10113 of at least one main shaft module 101 may be rotatably connected to the base 102 in a manner of a solid shaft. In this case, first swing arms 10113 of main shaft assemblies disposed opposite to the flexible display of the electronic device may be rotatably connected to the base 102 in the manner of the virtual shaft, and first swing arms 10113 of the main shaft assemblies located at two end parts in the length direction of the hinge mechanism 1 may be rotatably connected to the base 102 in the manner of the physical shaft.

Refer to FIG. 6 and FIG. 7. In this application, the first rotation assembly 1011 may further include a first housing fastening bracket 10114, where the first housing fastening bracket 10114, the first support arm 10112, and the first swing arm 10113 are located on a same side of the base 102, and the first housing fastening bracket 10114 is connected to the first support arm 10112 and the first swing arm 10113. In addition, when the hinge mechanism 1 provided in this application is used in an electronic device, the first housing fastening bracket 10114 may be fastened to a housing of the electronic device.

Still refer to FIG. 7 about how to set the first housing fastening bracket 10114. The first housing fastening bracket 10114 may be provided with a first sliding groove 101141, where the first sliding groove 101141 extends in a first direction, and the first support arm 10112 may be disposed in the first sliding groove 101141 and can slide in the first sliding groove 101141 in the first direction. The first direction may be a direction in which the first housing fastening bracket 10114 moves toward or away from the base 102. In addition, to prevent the first support arm 10112 from falling off from the first sliding groove 101141, a groove wall of the first sliding groove 101141 may be provided with a first sliding rail, and the first support arm 10112 may be provided with a first sliding block. In this way, the first sliding block may be clamped on the first sliding rail, and the first sliding block can slide along the first sliding rail, to limit the first support arm 10112 in the first sliding groove 101141. In addition, the first sliding rail is disposed on the groove wall of the first sliding groove 101141, so that the first sliding rail can provide guidance for the first support arm 10112 to slide along the first sliding groove 101141, thereby improving motion stability of the first support arm 10112.

Still refer to FIG. 7. In this embodiment, the first swing arm 10113 may be rotatably connected to the first housing fastening bracket 10114. In practice, an end that is of the first swing arm 10113 and that is used for installation of the first housing fastening bracket 10114 is provided with a first installation hole. In addition, the first housing fastening bracket 10114 is provided with a first installation part 101142, and the first installation part 101142 and the first sliding groove 101141 are disposed at an interval in a length direction of the first housing fastening bracket 10114. In this embodiment, the first installation hole may be rotatably connected to the first installation part 101142 through a rotation shaft. In another possible embodiment of this application, the first housing fastening bracket 10114 may be provided with a first installation hole, and the first swing arm 10113 is provided with a first installation part 101142. In this case, the first installation hole may also be rotatably connected to the first installation part 101142 through a rotation shaft.

In addition, in some possible embodiments of this application, the first swing arm 10113 and the first housing fastening bracket 10114 may alternatively be slidably connected. In practice, the first housing fastening bracket 10114 may be provided with a second sliding groove, the second sliding groove may extend in a second direction, and the first sliding groove 101141 and the second sliding groove are disposed at an interval in the length direction of the first housing fastening bracket 10114. In this case, an end part that is of the first swing arm 10113 and that faces the first housing fastening bracket 10114 may be disposed in the second sliding groove, and the first swing arm 10113 may slide in the second sliding groove in the second direction. It should be noted that, in this application, the first housing fastening bracket 10114 may include a first surface and a second surface that are disposed back to back with each other. The first surface may be a surface that is of the first housing fastening bracket 10114 and that faces the flexible display 4 when the hinge mechanism 1 is used in the electronic device. In this case, the second direction may be a direction from the first surface to the second surface, or a direction from the second surface to the first surface. In addition, a projection of the second direction in a first cross section may not be parallel to a projection of the first direction in the first cross section. The first cross section may be a reference plane perpendicular to a rotation axis of the first support arm 10112 and a rotation axis of the first swing arm 10113.

When the first swing arm 10113 is slidably connected to the first housing fastening bracket 10114, the second sliding groove may also be provided with a sliding rail, and the first swing arm 10113 may be provided with a sliding block. In this way, the sliding block may be clamped on the sliding rail, and the sliding block may slide in the second direction in the sliding rail, to limit the first swing arm 10113 in the second sliding groove, thereby preventing the first swing arm 10113 from falling off from the second sliding groove. In addition, the sliding rail is disposed on a groove wall of the second sliding groove, so that the sliding rail can provide guidance for the first swing arm 10113 to slide along the second sliding groove, thereby improving motion stability of the first swing arm 10113.

In this application, the first rotation assembly 1011 and the second rotation assembly 1012 may be symmetrically disposed relative to the base 102, and the second rotation assembly 1012 may be disposed with reference to the first rotation assembly 1011. For example, refer to FIG. 6 and FIG. 7. The second rotation assembly 1012 may further include a second support arm 10122, where the second support arm 10122 may be rotatably connected to the base 102, for example, the second support arm 10122 may be rotatably connected to the base 102 through a pin, or the second support arm 10122 may be rotatably connected to the base 102 in a manner of a virtual shaft. For details, refer to a connection manner of the first support arm 10112 and the base 102. Details are not described herein.

In addition, the second rotation assembly 1012 may further include a second swing arm 10123, and the second swing arm 10123 is rotatably connected to the base 102. For example, an end that is of the second swing arm 10123 and that is configured to connect to the base 102 may be provided with a second arc-shaped rotation block 101231. In addition, the base 102 may be provided with a second arc-shaped groove 1023. In this case, the second arc-shaped rotation block 101231 of the second swing arm 10123 may be accommodated in the second arc-shaped groove 1023, and may slide along an arc-shaped surface of the second arc-shaped groove 1023, to implement rotation of the second swing arm 10123 around the base 102. In some other embodiments of this application, the second swing arm 10123 may be rotatably connected to the base 102 in a manner of a physical shaft. For example, the second swing arm 10123 may be rotatably connected to the base 102 through a pin.

Still refer to FIG. 7. In this application, the second rotation assembly 1012 may further include a second housing fastening bracket 10124, the second housing fastening bracket 10124 is located on a same side of the base 102 as the second support arm 10122 and the second swing arm 10123, and the second housing fastening bracket 10124 is connected to the second support arm 10122 and the second swing arm 10123. In addition, when the hinge mechanism 1 provided in this application is used in an electronic device, the second housing fastening bracket 10124 may be fastened to another housing of the electronic device.

Still refer to FIG. 7 about how to set the second housing fastening bracket 10124. The second housing fastening bracket 10124 may be provided with a third sliding groove 101241, where the third sliding groove 101241 extends in a third direction, and the second support arm 10122 may be disposed in the third sliding groove 101241 and can slide in the third sliding groove 101241 in the third direction. The third direction may be a direction in which the second housing fastening bracket 10124 moves toward or away from the base 102. In addition, to prevent the second support arm from falling off from the third sliding groove 101241, a groove wall of the third sliding groove 101241 may be provided with a third sliding rail, and the second support arm 10122 may be provided with a third sliding block. In this way, the third sliding block may be clamped on the third sliding rail, and the third sliding block can slide along the third sliding rail, to limit the second support arm 10122 in the third sliding groove 101241. In addition, the third sliding rail is disposed on the groove wall of the third sliding groove 101241, so that the third sliding rail can provide guidance for the second support arm 10122 to slide along the third sliding groove 101241, thereby improving motion stability of the second support arm 10122.

Still refer to FIG. 7. In this embodiment, the second swing arm 10123 may be rotatably connected to the second housing fastening bracket 10124. In practice, an end that is of the second swing arm 10123 and that is used for installation of the second housing fastening bracket 10124 is provided with a second installation hole. In addition, the second housing fastening bracket 10124 is provided with a second installation part 101242, and the second installation part 101242 and the third sliding groove 101241 are disposed at an interval in a length direction of the second housing fastening bracket 10124. In this embodiment, the second installation hole may be rotatably connected to the second installation part 101242 through a rotation shaft. In another possible embodiment of this application, the second housing fastening bracket 10124 may be provided with a second installation hole, and the second swing arm 10123 is provided with a second installation part 101242. In this case, the second installation hole may also be rotatably connected to the second installation part 101242 through a rotation shaft.

In addition, in some possible embodiments of this application, the second swing arm 10123 and the second housing fastening bracket 10124 may alternatively be slidably connected. In practice, may be provided with a fourth sliding groove, the fourth sliding groove may extend in a fourth direction, and the third sliding groove 101241 and the fourth sliding groove are disposed at an interval in the length direction of the second housing fastening bracket 10124. In this case, an end part that is of the second swing arm 10123 and that faces the second housing fastening bracket 10124 may be disposed in the fourth sliding groove, and the second swing arm 10123 may slide in the fourth sliding groove in the fourth direction. It should be noted that, in this application, the second housing fastening bracket 10124 may include a third surface and a fourth surface that are disposed back to back with each other. The third surface may be a surface that is of the second housing fastening bracket 10124 and that faces the flexible display 4 when the hinge mechanism 1 is used in the electronic device. In this case, the fourth direction may be a direction from the third surface to the fourth surface, or a direction from the fourth surface to the third surface. In addition, a projection of the fourth direction in a second cross section may not be parallel to a projection of the third direction in the second cross section. The second cross section may be a reference plane perpendicular to a rotation axis of the second support arm 10122 and a rotation axis of the second swing arm 10123.

When the second swing arm 10123 is slidably connected to the second housing fastening bracket 10124, the fourth sliding groove may also be provided with a sliding rail, and the second swing arm 10123 may be provided with a sliding block. In this way, the sliding block may be clamped on the sliding rail, and the sliding block may slide in the fourth direction in the sliding rail, to limit the second swing arm 10123 in the fourth sliding groove, thereby preventing the second swing arm 10123 from falling off from the fourth sliding groove. In addition, the sliding rail is disposed on a groove wall of the fourth sliding groove, so that the sliding rail can provide guidance for the second swing arm 10123 to slide along the fourth sliding groove, thereby improving motion stability of the second swing arm 10123.

In this application, to form accommodation space between the first support plate 10111, the second support plate 10121, and the base 102, the first support plate 10111 may be rotatably connected to the first housing fastening bracket 10114, and the second support plate 10121 may be rotatably connected to the second housing fastening bracket 10124. It should be noted that the first support plate 10111 may be rotatably connected to a plurality of first housing fastening brackets 10114 that are located on a same side of the base 102, and the second support plate 10121 may be rotatably connected to a plurality of second housing fastening brackets 10124 that are located on a same side of the base 102. This helps simplify a structure of the hinge mechanism 1, and can improve structure reliability of the hinge mechanism 1.

Specifically, when the first support plate 10111 and the first housing fastening bracket 10114 are rotatably connected, refer to FIG. 6. The first housing fastening bracket 10114 may be provided with a first rotation groove 101143, and the first rotation groove 101143 may be a circular-arc-shaped groove. In addition, an end part that is of the first support plate 10111 and that faces the first housing fastening bracket 10114 may be provided with a first rotation part 101113. The first rotation part 101113 may be set to an arc, for example, a circular arc. In this way, the first rotation part 101113 may be disposed in the first rotation groove 101143, and the first rotation part 101113 may slide along a groove surface of the first rotation groove 101143, to implement relative rotation between the first support plate 10111 and the first housing fastening bracket 10114. It may be understood that, to improve stability of rotation of the first support plate 10111 around the first housing fastening bracket 10114, the first housing fastening bracket 10114 may be provided with a plurality of first rotation grooves 101143, and the first support plate 10111 may be provided with a plurality of first rotation parts 101113. In this way, the first rotation parts 101113 each may be disposed in one first rotation groove 101143 in a one-to-one correspondence, so that each first rotation part 101113 slides around a groove surface of a corresponding first rotation groove 101143, to implement relative rotation between the first support plate 10111 and the first housing fastening bracket 10114.

Similarly, when the second support plate 10121 and the second housing fastening bracket 10124 are specifically rotatably connected, still refer to FIG. 6. The second housing fastening bracket 10124 may be further provided with a second rotation groove 101243, and the second rotation groove 101243 may be a circular-arc-shaped groove. In addition, an end part that is of the second support plate 10121 and that faces the second housing fastening bracket 10124 may be provided with a second rotation part 101213. The second rotation part 101213 may be set to an arc, for example, a circular arc. In this way, the second rotation part 101213 may be disposed in the second rotation groove 101243, and the second rotation part 101213 may slide along a groove surface of the second rotation groove 101243, to implement relative rotation between the second support plate 10121 and the second housing fastening bracket 10124. In addition, the second housing fastening bracket 10124 may be provided with a plurality of second rotation grooves 101243, and the second support plate 10121 is provided with a plurality of second rotation parts 101213. In this way, the second rotation parts 101213 each may be disposed in one second rotation groove 101243 in a one-to-one correspondence, so that each second rotation part 101213 slides around a groove surface of a corresponding second rotation groove 101243, to implement relative rotation between the second support plate 10121 and the second housing fastening bracket 10124, thereby improving stability of rotation of the second support plate 10121 around the second housing fastening bracket 10124.

In this application, the first support plate 10111 and the first housing fastening bracket 10114, and the second support plate 10121 and the second housing fastening bracket 10124 may be rotatably connected by using the foregoing virtual shafts, or may be rotatably connected in another possible manner. For example, in some other possible embodiments of this application, the first support plate 10111 may alternatively be rotatably connected to the first housing fastening bracket 10114 through a first pin, so that the first support plate 10111 is rotatably connected to the first housing fastening bracket 10114 through a physical shaft. Similarly, the second support plate 10121 may alternatively be rotatably connected to the second housing fastening bracket 10124 through a second pin, so that the first support plate 10111 is rotatably connected to the first housing fastening bracket 10114 through a physical shaft.

Figure 8:
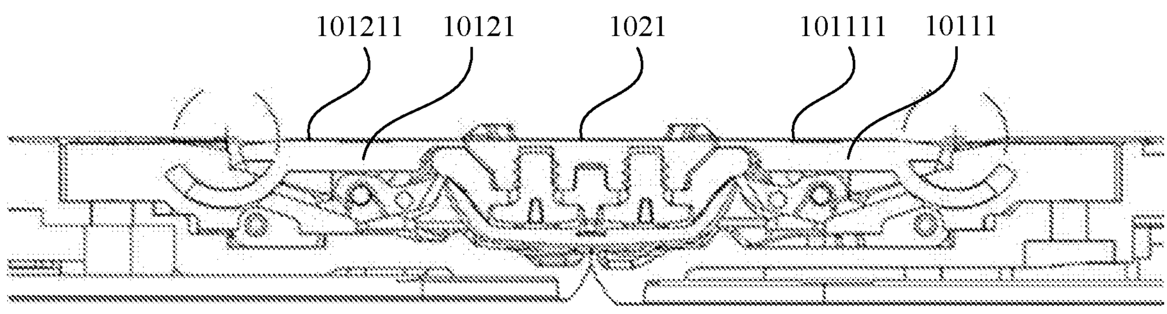
FIG. 8 is a diagram of a structure of a hinge mechanism according to an embodiment of this application.

Refer to FIG. 8. FIG. 8 is a diagram of a structure of the hinge mechanism 1 according to a possible embodiment of this application. In FIG. 8, the electronic device is in an unfolded state. In this case, the first plate surface 101111 of the first support plate 10111, the second plate surface of the second support plate 10121, and the bearing surface 1021 of the base 102 may be in a same plane, so that the flexible display 4 of the electronic device can be flatly supported.

It can be known from the descriptions of the structures of the first rotation assembly 1011 and the second rotation assembly 1012 in the foregoing embodiment that, in the first rotation assembly 1011, the first housing fastening bracket 10114 may drive the first support arm 10112 and the first swing arm 10113 to rotate around the base 102, and in the second rotation assembly 1012, the second housing fastening bracket 10124 may drive the second support arm 10122 and the second swing arm 10123 to rotate around the base 102. Based on this, it may be considered that the first support arm 10112 and/or the first swing arm 10113 rotate/rotates around the base 102 to drive the first support plate 10111 to rotate around the first housing fastening bracket 10114. Similarly, the second support arm 10122 and/or the second swing arm 10123 may also rotate around the base 102 to drive the second support plate 10121 to rotate around the second housing fastening bracket 10124.

Figure 9:
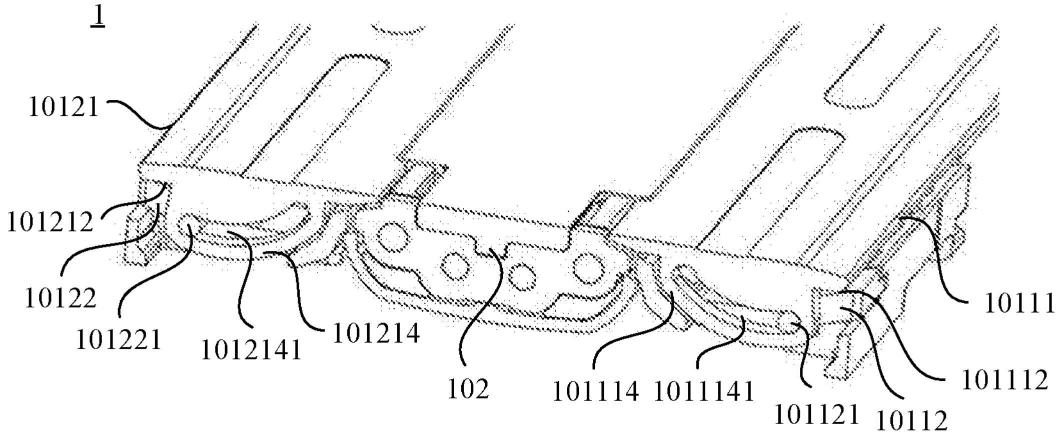
FIG. 9 is a sectional view of a hinge mechanism in an electronic device in an unfolded state according to an embodiment of this application.

In practice, refer to FIG. 9. FIG. 9 is a sectional view of the hinge mechanism 1 according to a possible embodiment of this application. FIG. 9 may be used to show a structure of a second surface of the first support plate 10111 and a connection relationship between the first support plate 10111 and another structure of the hinge mechanism 1 in the electronic device in the unfolded state. In this application, the second surface of the first support plate 10111 may be denoted as a third plate surface 101112. The third plate surface 101112 of the first support plate 10111 may be provided with a first guiding part 101114, and the first guiding part 101114 may be provided with a first track groove 1011141. In addition, in this application, the first support arm 10112 may be provided with a first guiding structure 101121. The first guiding structure 101121 may be but is not limited to a columnar structure, and the first guiding structure 101121 may be inserted into the first track groove 1011141 of the first guiding part 101114 of the first support plate 10111, and can slide along the first track groove 1011141. In this way, in a process in which the first support arm 10112 rotates around the base 102, the first guiding structure 101121 may slide in the first track groove 1011141, to drive the first support plate 10111 to rotate around the first housing fastening bracket 10114.

In the embodiment shown in FIG. 9, the first track groove 1011141 of the first guiding part 101114 may be a closed groove, and the first guiding part 101114 may be a guiding shaft. In this way, motion reliability of the first guiding part 101114 in the first track groove 1011141 can be improved, so that motion of the first support plate 10111 is stable.

Figure 10:
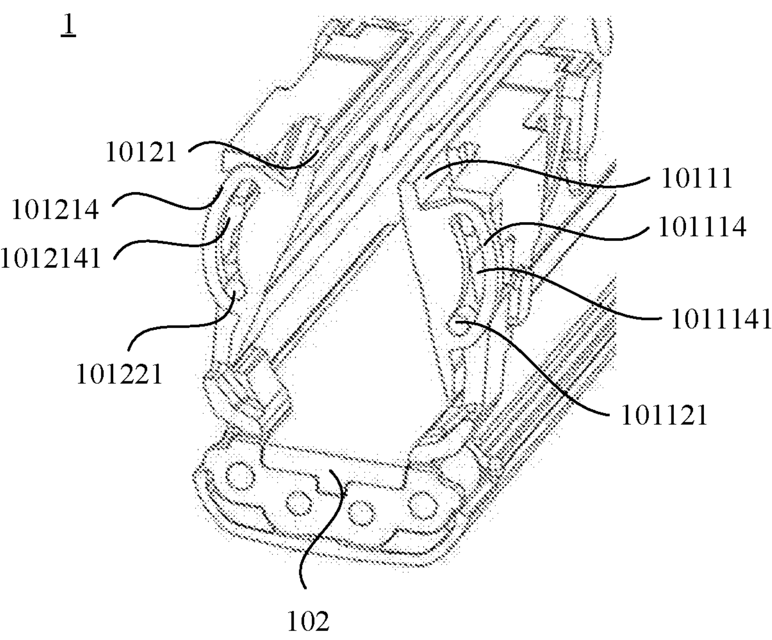
FIG. 10 is a sectional view of a hinge mechanism in an electronic device in a folded state according to an embodiment of this application.

It may be understood that, in this application, a motion track of the first support plate 10111 may be adjusted by adjusting a form of the first track groove 1011141. For example, in the embodiment shown in FIG. 9, the first track groove 1011141 may be an arc-shaped groove, and when the electronic device is in the unfolded state, the first guiding part 101114 may be located at an end part that is of the first track groove 1011141 and that is away from the base 102. In addition, refer to FIG. 10. FIG. 10 is a sectional view of the hinge mechanism 1 in the electronic device in the folded state. As shown in FIG. 10, in the folded state, the first guiding part 101114 may be located at an end part that is of the first track groove 1011141 and that is close to the base 102. It can be learned that, in a rotation process of the electronic device from the unfolded state to the folded state, the first guiding part 101114 may move relative to the first track groove 1011141 in a direction toward the base 102, to drive the first support plate 10111 to rotate around the first housing fastening bracket 10114, and drive an end part that is of the first support plate 10111 and that is close to the base 102 to move in a direction away from the base 102.

Figure 11:
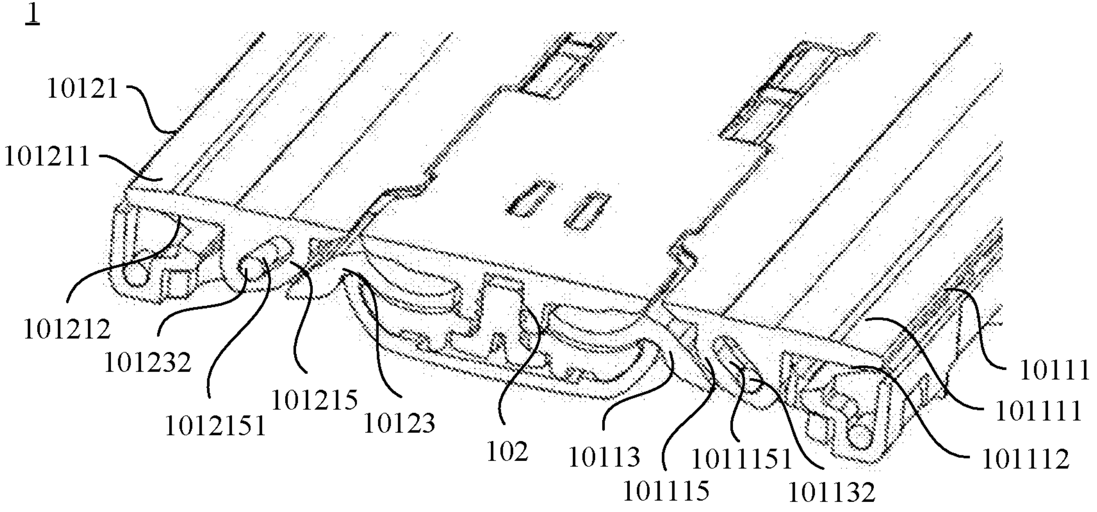
FIG. 11 is a sectional view of a hinge mechanism in an electronic device in an unfolded state according to another embodiment of this application.

In another possible embodiment of this application, the first swing arm 10113 may further drive the first support plate 10111 to rotate around the first housing fastening bracket 10114. In practice, refer to FIG. 11. The third plate surface 101112 of the first support plate 10111 may be provided with a second guiding part 101115, and the second guiding part 101115 may be provided with a second track groove 1011151. In addition, the first swing arm 10113 may be provided with a second guiding structure 101132. The second guiding structure 101132 may be but is not limited to a columnar structure, and the second guiding structure 101132 may be inserted into the second track groove 1011151 of the second guiding part 101115 of the first support plate 10111, and can slide along the second track groove 1011151. In this way, in a process in which the first swing arm 10113 rotates around the base 102, the second guiding structure 101132 may slide in the second track groove 1011151, to drive the first support plate 10111 to rotate around the first housing fastening bracket 10114. In this embodiment, the second track groove 1011151 of the second guiding part 101115 may be a closed groove, and the second guiding part 101115 may be a guiding shaft. In this way, motion reliability of the second guiding part 101115 in the second track groove 1011151 can be improved, so that motion of the first support plate 10111 is stable. In this application, a motion track of the first support plate 10111 may be adjusted by adjusting a form of the second track groove 1011151. For example, in the embodiment shown in FIG. 11, the second track groove 1011151 may be a straight groove, and in the unfolded state shown in FIG. 11, in a direction from the first plate surface 101111 to the third plate surface 101112, the second track groove 1011151 extends in a direction away from the base 102.

Figure 12:
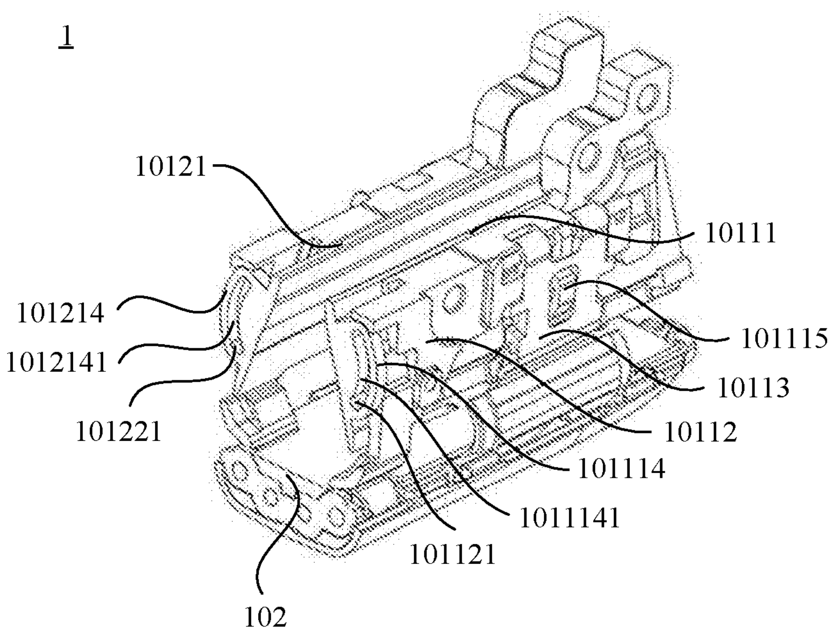
FIG. 12 is a diagram of a partial structure of a hinge mechanism according to another embodiment of this application.

In some possible embodiments of this application, the first support plate 10111 may be alternatively slidably connected to both the first support arm 10112 and the first swing arm 10113. In practice, refer to FIG. 12. FIG. 12 is a diagram of a partial structure of the hinge mechanism 1 according to another embodiment of this application. In this embodiment, the first support plate 10111 may include a first guiding part 101114 and a second guiding part 101115. The first guiding part 101114 has a first track groove 1011141, and the second guiding part 101115 has a second track groove 1011151 (not shown in FIG. 12, and reference may be made to FIG. 11). In addition, the first support arm 10112 may have a first guiding structure 101121, and the first swing arm 10113 may have a second guiding structure 101132 (not shown in FIG. 12, and reference may be made to FIG. 11). For specific disposing manners of the first track groove 1011141, the second track groove 1011151, the first guiding structure 101121, and the second guiding structure 101132, refer to the foregoing embodiment. Details are not described herein again. In this way, the first support arm 10112 and the first swing arm 10113 may rotate around the base 102, so that the first guiding structure 101121 slides along the first track groove 1011141, and the second guiding structure 101132 slides along the second track groove 1011151, to drive the first support plate 10111 to rotate around the first housing fastening bracket 10114, thereby effectively improving motion stability of the first support plate 10111.

Figure 13:
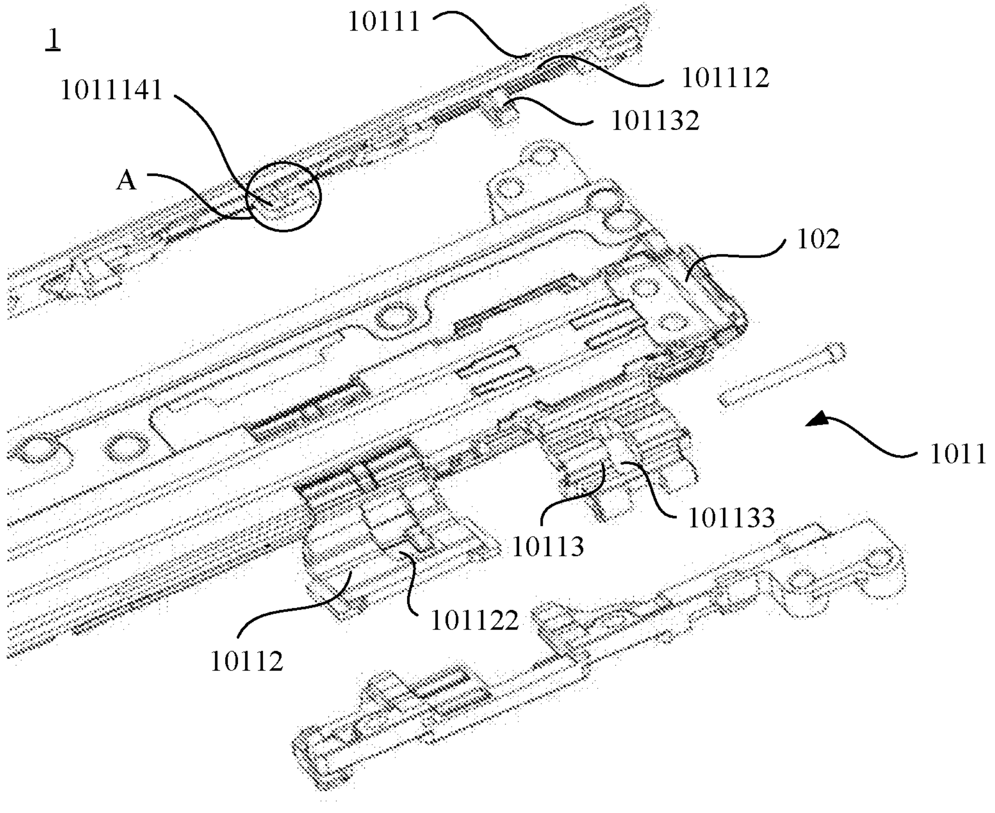
FIG. 13 is a diagram of a structure of a hinge mechanism according to another embodiment of this application.
Figure 14:
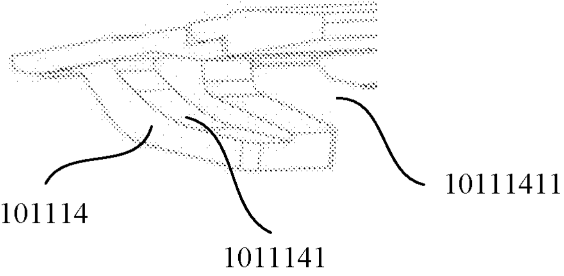
FIG. 14 is an enlarged view of a partial structure at A of the hinge mechanism shown in FIG. 13.

In this application, the first track groove 1011141 may be set in another possible form in addition to being set as a closed groove. In practice, refer to FIG. 13. FIG. 13 is a diagram of a structure of the hinge mechanism 1 according to another embodiment of this application. FIG. 13 is an exploded view of a partial structure of the first rotation assembly 1011. In this embodiment, the first track groove 1011141 may be an open groove. In practice, refer to FIG. 14. FIG. 14 is an enlarged view of a partial structure at A of the hinge mechanism shown in FIG. 13. The first track groove 1011141 may have a first opening 10111411. In addition, refer to FIG. 13 and FIG. 14. The first opening 10111411 may be disposed in a direction away from the base 102.

Figure 15:
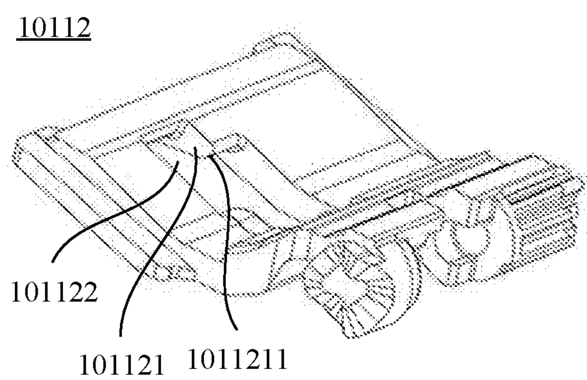
FIG. 15 is a diagram of a structure of a first support arm of the hinge mechanism shown in FIG. 13.

To enable the first support arm 10112 to drive the first support plate 10111, a disposing form of the first guiding structure 101121 may be adaptively adjusted. For example, refer to FIG. 15. FIG. 15 is a diagram of a structure of the first support arm 10112 of the hinge mechanism 1 shown in FIG. 13. In this embodiment, the first guiding structure 101121 may have a first guiding surface 1011211. In this application, a specific disposing form of the first guiding surface 1011211 is not limited, and the first guiding surface 1011211 may be, for example, a circular-arc-shaped surface, an elliptical surface, an oblique surface, or the like. The first guiding surface 1011211 may be attached to a groove wall of the first track groove 1011141, so that in a process in which the first support arm 10112 rotates around the base 102, the first guiding surface 1011211 may slide along the groove wall of the first track groove 1011141, to drive the first support plate 10111 to rotate around the first housing fastening bracket 10114.

In addition, in this embodiment of this application, the first guiding structure 101121 and the first support arm 10112 may be an integral structure, that is, the first guiding structure 101121 may be a part of the first support arm 10112, so that a structure of the first support arm 10112 is simple and reliable, and structure reliability of the hinge mechanism 1 can be improved.

Still refer to FIG. 15. The first support arm 10112 may be further set to have a first hollow zone 101122, and the first guiding structure 101121 may be disposed in the first hollow zone 101122. In addition, a disposing position of the first hollow zone 101122 may be adjusted based on a position of the first guiding part 101114. In this way, at least a part of the first guiding part 101114 shown in FIG. 13 and FIG. 14 may be inserted into the first hollow zone 101122, to implement fitting between the first guiding structure 101121 and the first track groove 1011141, so that the first support arm 10112 and the first support plate 10111 are fit compactly. This helps implement a miniaturization design of the hinge mechanism 1.

Figure 16:
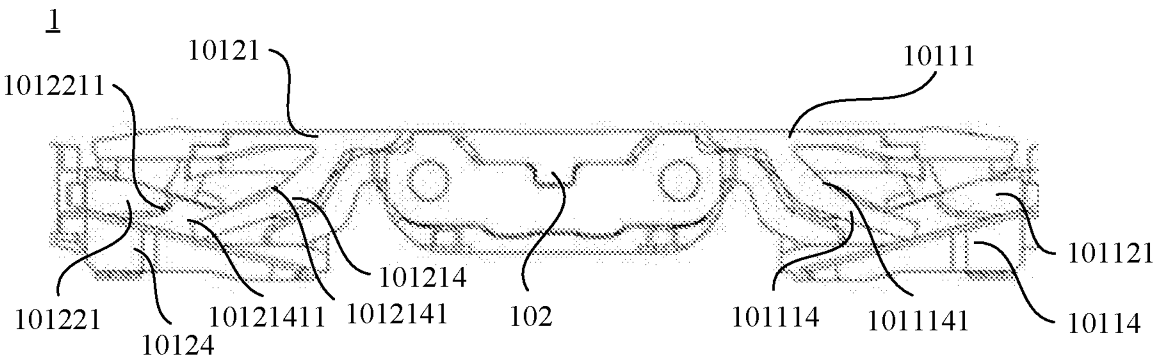
FIG. 16 is a sectional view of the hinge mechanism shown in FIG. 13.

Refer to FIG. 16. FIG. 16 is a sectional view of the hinge mechanism 1 shown in FIG. 13, and shows a structure of the first guiding part 101114 of the first support plate 10111 in the electronic device in the unfolded state. It can be learned from FIG. 16 that, in this embodiment of this application, the first track groove 1011141 is set as an open groove, so that the first guiding part 101114 can occupy less space, and space can be reserved for another structure in the hinge mechanism 1. For example, a thickness of the first housing fastening bracket 10114 may be increased, to help improve structure strength of the hinge mechanism 1.

Figure 17:
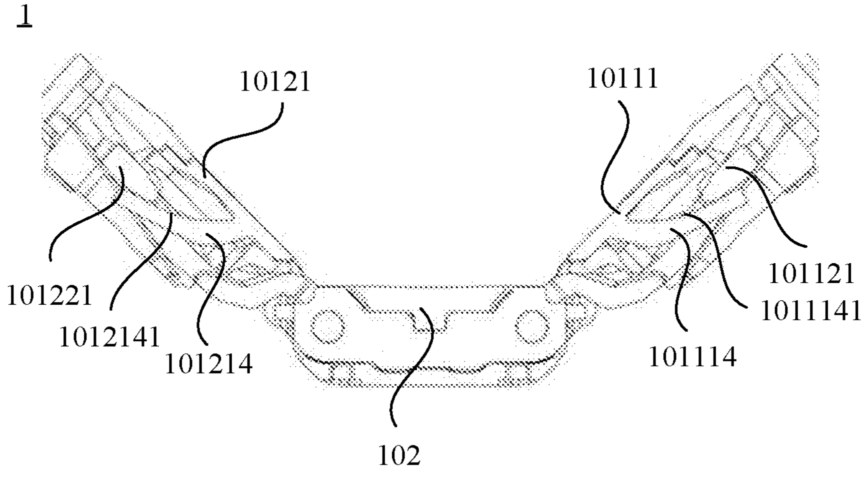
FIG. 17 is a sectional view of a hinge mechanism in an electronic device in an intermediate state according to another embodiment of this application.

In the state shown in FIG. 16, the first guiding structure 101121 may be located at an end that is of the first track groove 1011141 and that is away from the base 102, or may even be located at an outer side of the first opening 10111411. In addition, refer to FIG. 17. FIG. 17 is a sectional view of the hinge mechanism 1 in the electronic device in an intermediate state. It can be seen from comparison between FIG. 16 and FIG. 17 that, in the process in which the electronic device rotates from the unfolded state to the folded state, the first guiding structure 101121 may slide to the inside of the first track groove 1011141, to drive the first support plate 10111 to rotate around the first housing fastening bracket 10114.

Figure 18:
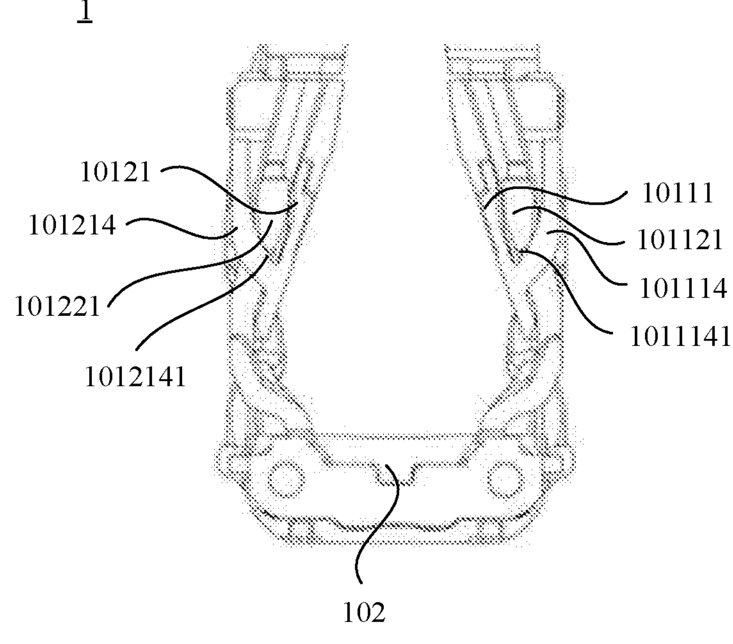
FIG. 18 is a sectional view of a hinge mechanism in an electronic device in a folded state according to another embodiment of this application.

When the electronic device is in the shown folded state, refer to FIG. 18. FIG. 18 is a sectional view of the hinge mechanism 1 in this state. It can be seen from comparison between FIG. 17 and FIG. 18 that, in a process in which the electronic device rotates from the intermediate state to the folded state, the first guiding structure 101121 continues to slide along the first track groove 1011141, and drives the end part that is of the first support plate 10111 and that is close to the base 102 to continue to move in a direction away from the base 102. In the folded state, the first guiding structure 101121 is located at an end that is of the first track groove 1011141 and that is close to the base 102, and in this case, an end part that is of the first support plate 10111 and that is close to the base 102 is farthest away from the base 102.

Figure 19:
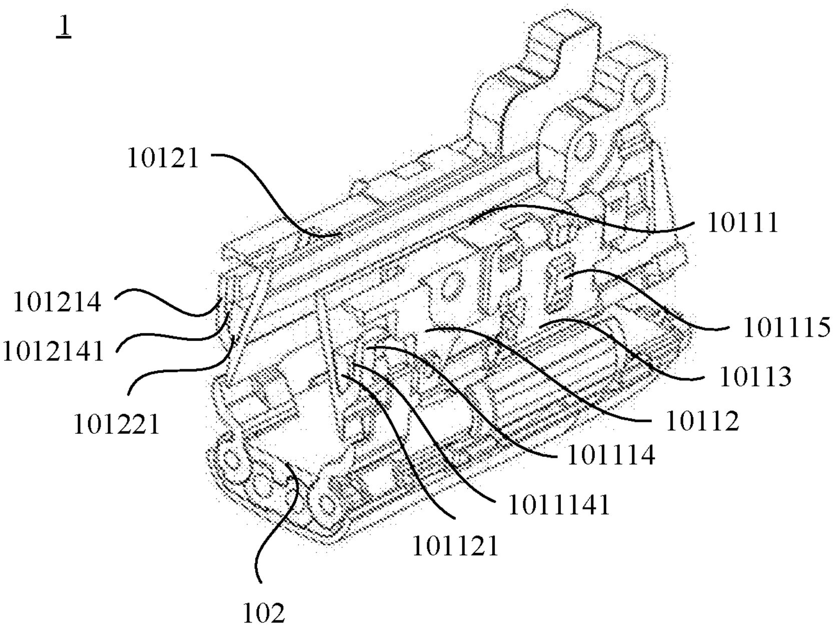
FIG. 19 is a diagram of a partial structure of the hinge mechanism shown in FIG. 13.

In the embodiment shown in FIG. 13 of this application, the first support arm 10112 and the first swing arm 10113 may alternatively jointly drive the first support plate 10111 to move. In practice, refer to FIG. 19. FIG. 19 is a diagram of a partial structure of the hinge mechanism 1 shown in FIG. 13. The first support plate 10111 may be further provided with a second guiding part 101115, the second guiding part 101115 may be provided with a second track groove 1011151, and the second track groove 1011151 may be a closed groove. In addition, the first swing arm 10113 may be further provided with a second guiding structure 101132, and the second guiding structure 101132 may be a guiding shaft. In this embodiment, the second track groove 1011151 and the second guiding structure 101132 may be disposed with reference to the foregoing embodiment, and details are not described herein again.

Still refer to FIG. 13 and FIG. 19. In this application, the first swing arm 10113 may be further set to have a second hollow zone 101133, and at least a part of the second guiding structure 101132 may be disposed in the second hollow zone 101133. In addition, a disposing position of the second hollow zone 101133 may be adjusted based on a position of the second guiding part 101115. In this way, at least a part of the second guiding part 101115 may be inserted into the second hollow zone 101133, to implement fitting between the second guiding structure 101132 and the second track groove 1011151, so that the first swing arm 10113 and the first support plate 10111 are fit compactly. This helps implement a miniaturization design of the hinge mechanism 1.

Based on the description of the hinge mechanism 1 shown in FIG. 13, in some other possible embodiments of this application, when the first support arm 10112 and the first swing arm 10113 jointly drive the first support plate 10111 to move, the first track groove 1011141 may alternatively be a closed groove, and the second track groove 1011151 may be set as an open groove. In this case, the first track groove 1011141 may be disposed with reference to the embodiments shown in FIG. 9 and FIG. 10, and the second track groove 1011151 may be disposed with reference to the first track groove 1011141 in the embodiment shown in FIG. 13. Details are not described herein again.

In this application, the first rotation assembly 1011 and the second rotation assembly 1012 may be symmetrically disposed. Therefore, a manner of driving the second support plate 10121 to move may be set with reference to the foregoing manner of driving the first support plate 10111 to move. For example, refer to FIG. 9. FIG. 9 further shows a structure of a second surface of the second support plate 10121 and a connection relationship between the second support plate 10121 and another structure of the hinge mechanism 1. The second surface of the second support plate 10121 may be denoted as a fourth plate surface 101212. The fourth plate surface 101212 of the second support plate 10121 may be provided with a third guiding part 101214, and the third guiding part 101214 may be provided with a third track groove 1012141. In addition, in this application, the second support arm 10122 may further be provided with a third guiding structure 101221. Both the third track groove 1012141 and the third guiding structure 101221 may be disposed with reference to the first track groove 1011141 and the first guiding structure 101121 shown in FIG. 9. Details are not described herein again. In this way, the second support arm 10122 may drive the second support plate 10121 to rotate around the second housing fastening bracket 10124.

In addition, similar to the first support arm 10112 shown in FIG. 13, the second support arm 10122 may further have a third hollow zone (not shown in FIG. 13), and the third guiding structure 101221 may be disposed in the third hollow zone. In addition, a disposing position of the third hollow zone may be adjusted based on a position of the third guiding part 101214. In this way, at least a part of the third guiding part 101214 may be inserted into the third hollow zone, to implement fitting between the third guiding structure 101221 and the third track groove 1012141, so that the second support arm 10122 and the second support plate 10121 are fit compactly. This helps implement a miniaturization design of the hinge mechanism 1.

In this application, the second swing arm 10123 may further drive the second support plate 10121 to rotate around the second housing fastening bracket 10124. In practice, refer to FIG. 11. The fourth plate surface 101212 of the second support plate 10121 may be provided with a fourth guiding part 101215, and the fourth guiding part 101215 may be provided with a fourth track groove 1012151. In addition, the second swing arm 10123 may be provided with a fourth guiding structure 101232. For both the fourth track groove 1012151 and the fourth guiding structure 101232, refer to the second track groove 1011151 and the second guiding structure 101132 shown in FIG. 11. Details are not described herein again.

In this application, a motion track of the second support plate 10121 may be adjusted by adjusting a form of the fourth track groove 1012151. For example, in the embodiment shown in FIG. 11, the fourth track groove 1012151 may be a straight groove, and in the unfolded state shown in FIG. 11, in a direction from the second plate surface 101211 to the fourth plate surface 101212, the fourth track groove 1012151 extends in a direction away from the base 102.

In addition, in this application, the second swing arm 10123 may be further set to have a fourth hollow zone, and at least a part of the fourth guiding structure 101232 may be disposed in the fourth hollow zone. In addition, a disposing position of the fourth hollow zone may be adjusted based on a position of the fourth guiding part 101215. In this way, at least a part of the fourth guiding part 101215 can be inserted into the fourth hollow zone, to implement fitting between the fourth guiding structure 101232 and the fourth track groove 1012151, so that the second swing arm 10123 and the second support plate 10121 are fit compactly. This helps implement a miniaturization design of the hinge mechanism 1.

In some other possible embodiments of this application, the second support plate 10121 may be driven simultaneously by using the second support arm 10122 and the second swing arm 10123. In other words, both the third guiding part 101214 shown in FIG. 9 and the fourth guiding part 101215 shown in FIG. 11 may be disposed on the second support plate 10121. The third guiding part 101214 has a third track groove 1012141, and the fourth guiding part 101215 has a fourth track groove 1012151. In addition, the second support arm 10122 may have a third guiding structure 101221, and the second swing arm 10123 may have a fourth guiding structure 101232. For specific disposing manners of the third track groove 1012141, the fourth track groove 1012151, the third guiding structure 101221, and the fourth guiding structure 101232, refer to the foregoing embodiment. Details are not described herein again. In this way, the second support arm 10122 and the second swing arm 10123 may rotate around the base 102 to drive the second support plate 10121 to rotate around the second housing fastening bracket 10124. This can effectively improve motion stability of the second support plate 10121.

In addition, in this application, the third track groove 1012141 may alternatively be set as an open groove. Refer to FIG. 16. In this embodiment, both the third track groove 1012141 and the third guiding structure 101221 may be disposed with reference to the first track groove 1011141 and the first guiding structure 101121 shown in FIG. 16. For example, the third track groove 1012141 may have a second opening 10121411, and the second opening 10121411 may be disposed in a direction away from the base 102. The third guiding structure 101221 may have a second guiding surface 1012211, and the second guiding surface 1012211 may be, for example, a circular-arc-shaped surface, an elliptical surface, an oblique surface, or the like. In addition, the second guiding surface 1012211 may be attached to a groove wall of the third track groove 1012141, so that in a process in which the second support arm 10122 rotates around the base 102, the second guiding surface 1012211 may slide along the groove wall of the third track groove 1012141, to drive the second support plate 10121 to rotate around the second housing fastening bracket 10124. The third track groove 1012141 is set as an open groove, so that the third guiding part 101214 can be disposed to occupy less space, and space may be reserved for another structure in the hinge mechanism 1. For example, a thickness of the second housing fastening bracket 10124 may be increased, to help improve structure strength of the hinge mechanism 1.

When the third track groove 1012141 may be set as the open groove, the first support arm 10112 and the first swing arm 10113 may alternatively jointly drive the first support plate 10111 to move. In this case, the fourth guiding part 101215 and the fourth guiding structure 101232 may be disposed with reference to the foregoing embodiment, and details are not described herein again.

In addition, when the second support arm 10122 and the second swing arm 10123 jointly drive the second support plate 10121 to move, the third track groove 1012141 may alternatively be set as a closed groove, and the fourth track groove 1012151 is set as an open groove. In this case, the third track groove 1012141 may be disposed with reference to the embodiments shown in FIG. 9 and FIG. 10, and the fourth track groove 1012151 may be disposed with reference to the third track groove 1012141 in the embodiment shown in FIG. 16. Details are not described herein again.

Figure 20:
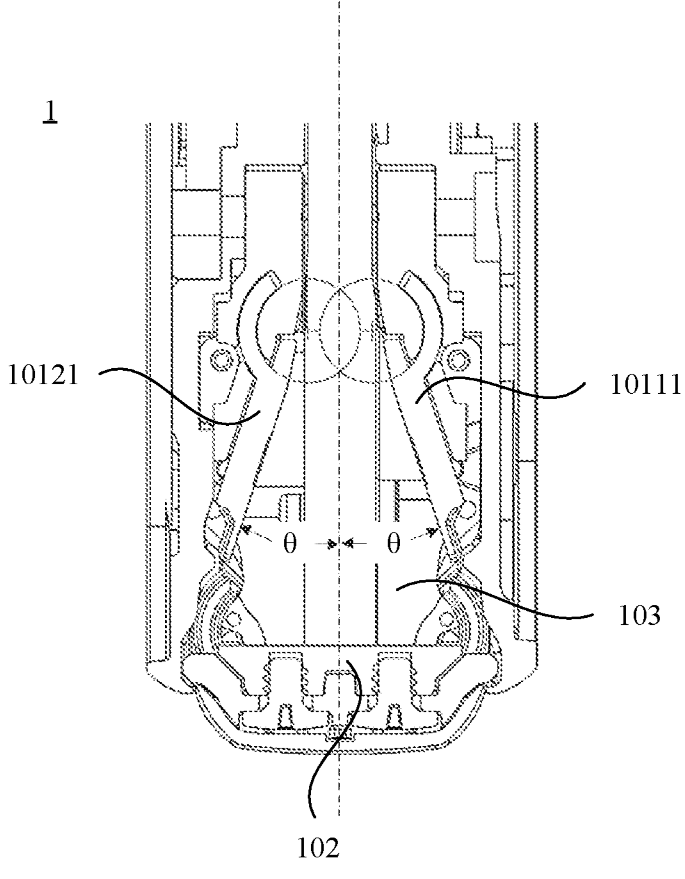
FIG. 20 is a diagram of display accommodation space formed when an electronic device is in a folded state according to an embodiment of this application.

In this application, when the first housing fastening bracket 10114 and the second housing fastening bracket 10124 rotate toward each other, the first support arm 10112 and/or the first swing arm 10113 may drive an end that is of the first support plate 10111 and that is close to the base 102 to move in a direction away from the base 102, and the second support arm 10122 and/or the second swing arm 10123 drive/drives an end that is of the second support plate 10121 and that is close to the base 102 to move in a direction away from the base 102. In this way, refer to FIG. 20. FIG. 20 shows that when the electronic device is in the folded state, the first support plate 10111, the second support plate 10121, and the base 102 may form the display accommodation space 103.

It may be understood from the foregoing description of the hinge mechanism 1 that, in a process in which the electronic device changes from the unfolded state to the folded state, the first support plate 10111 may rotate around the first housing fastening bracket 10114 under driving of the first swing arm 10113 and/or the first support arm 10112, so that an end part that is of the first support plate 10111 and that is close to the base 102 moves in the direction away from the base 102. In addition, the second support plate 10121 may rotate around the second housing fastening bracket 10124 under driving of the second swing arm 10123 and/or the second support arm 10122, so that an end part that is of the second support plate 10121 and that is close to the base 102 moves in a direction away from the base 102. In this way, the first rotation assembly 1011 and the second rotation assembly 1012 of the hinge mechanism 1 are symmetrically disposed relative to each other or relative to the base 102. In this way, the display accommodation space 103 formed between the first support plate 10111, the second support plate 10121, and the base 102 is a symmetric interval shown in FIG. 20. In this way, a bendable part that is of the flexible display and that is accommodated in the display accommodation space 103 may be in a water drop shape. In this way, squeezing on the flexible display can be avoided, and a risk of damage to the flexible display can be reduced.

The hinge mechanism 1 provided in the foregoing embodiments of this application may be used in, for example, the electronic device shown in FIG. 1 or FIG. 2. The first housing fastening bracket 10114 may be fastened to a housing located on a same side of the base 102, and the second housing fastening bracket 10124 may be fastened to another housing. For example, the first housing fastening bracket 10114 may be used to be fastened to the first housing 2 of the electronic device shown in FIG. 2, and the second housing fastening bracket 10124 may be used to be fastened to the second housing 3 of the electronic device shown in FIG. 2.

In addition, the flexible display 4 of the electronic device is fastened to the first support plate 10111 and the second support plate 10121, and a connection manner of the flexible display 4 may be but is not limited to bonding. In practice, the flexible display 4 may be bonded to a part of the first plate surface 101111 of the first support plate 10111. For example, the flexible display 4 may be bonded to a partial area that is of the first plate surface 101111 and that is close to the base 102, and the flexible display 4 may be bonded to a partial area of the second plate surface of the second support plate 10121, for example, bonded to a partial area that is of the second plate surface and that is close to a housing of a corresponding side. In this way, when the electronic device is in the unfolded state, the bearing surface 1021 of the base 102, the first support surface 202 of the first housing 2, the second support surface 302 of the second housing 3, the first plate surface 101111 of the first support plate 10111, and the second plate surface 101211 of the second support plate 10121 can jointly provide flat support for the flexible display 4, thereby ensuring that a form of the electronic device in the unfolded state is complete. In the process in which the electronic device changes from the unfolded state to the folded state, the two support plates can drive the flexible display 4 to rotate. This can effectively avoid deformation of the flexible display 4, and reduce a risk of damage to the flexible display 4.

It should be understood that, to implement the form of the electronic device, this application is not limited to embodiments of the hinge mechanisms 1 mentioned above, provided that the hinge mechanisms 1 in the following states can be implemented.

When the electronic device is in a folded state, an included angle between the first plate surface 101111 and the first support surface 202 is equal to an included angle between the second plate surface and the second support surface 302, to form the display accommodation space 103 between the first plate surface 101111, the second plate surface, and the bearing surface 1021. In this way, when the electronic device is in the unfolded state, the bearing surface 1021 of the base 102, the first support surface 202 of the first housing 2, the second support surface 302 of the second housing 3, the first plate surface 101111 of the first support plate 10111, and the second plate surface of the second support plate 10121 can jointly provide flat support for the flexible display 4.

In addition, in this application, the first track groove 1011141 and/or the second track groove 1011151 of the first support plate 10111 and the third track groove 1012141 and/or the fourth track groove 1012151 of the second support plate 10121 can be properly designed, so that when the electronic device is in the folded state, sufficient accommodation space is formed between the two support plates and the base 102 to accommodate the bendable part of the flexible display 4. This can avoid a gap in the electronic device at the hinge mechanism 1, thereby ensuring that the form of the electronic device in the folded state is complete. This can avoid damage to the flexible display 4 caused by a foreign matter inserted into the electronic device at the hinge mechanism 1, and implement a thinning design of an overall thickness of the electronic device.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A hinge mechanism, comprising:

- a base comprising a bearing surface configured to support a flexible display of an electronic device; and
- a main shaft module comprising:
  - a first side;
  - a second side opposite the first side;
  - a first rotation assembly disposed on the first side and comprising:
    - a first housing fastening bracket;
    - a first support plate rotatably connected to the first housing fastening bracket and comprising:
      - a first plate surface configured to support the flexible display;
      - a first guiding part comprising a first groove;
      - a second guiding part comprising a second groove; and
      - a first end proximate to the base;
    - a first support arm rotatably connected to the base, slidably connected to the first housing fastening bracket, and comprising:
      - a first guiding structure inserted into the first groove and configured to slide along the first groove; and
      - a first axis of rotation; and
    - a first swing arm rotatably connected to the base and comprising:
      - a second guiding structure inserted into the second groove and configured to slide along the second groove; and
      - a second axis of rotation that is parallel to the first axis of rotation and does not coincide with the first axis of rotation; and
  - a second rotation assembly disposed on the second side and comprising:
    - a second housing fastening bracket;
    - a second support plate configured to support the flexible display and comprising:
      - a second plate surface configured to support the flexible display;
      - a third guiding part comprising a third groove;
      - a fourth guiding part comprising a fourth groove; and
      - a second end proximate to the base; and a second support arm rotatably connected to the base, slidably connected to the second housing fastening bracket, and comprising:

a third guiding structure inserted into the third groove and configured to slide along the third groove; and a third axis of rotation; and a second swing arm rotatably connected to the base and comprising:

a fourth guiding structure inserted into the fourth groove and configured to slide along the fourth groove; and a fourth axis of rotation that is parallel to the third axis of rotation and that does not coincide with the third axis of rotation, wherein when the first housing fastening bracket and the second housing fastening bracket rotate toward each other, the first support arm and the first swing arm are configured to rotate around the base, the first guiding structure is configured to slide along the first groove, the second guiding structure is configured to slide along the second groove, the first support plate is configured to rotate relative to the first housing fastening bracket, the first end is configured to move in a first direction away from the base, the second support arm and the second swing arm are configured to rotate around the base, the third guiding structure is configured to slide along the third groove, the fourth guiding structure is configured to slide along the fourth groove, the second support plate is configured to rotate relative to the second housing fastening bracket, and the second end is configured to move in a second direction away from the base to form, between the first plate surface, the second plate surface, and the bearing surface, a display accommodation space configured to accommodate a bendable part of the flexible display, and wherein the first groove comprises a first opening and a first groove wall, wherein the first opening is disposed in a third direction away from the base, wherein the first guiding structure comprises a first guiding surface configured to slide along the first groove wall, wherein the third groove comprises a second opening and a second groove wall, wherein the second opening is disposed in a fourth direction away from the base, and wherein the third guiding structure comprises a second guiding surface configured to slide along the second groove wall.

2. The hinge mechanism of claim 1, wherein the second groove is a first closed groove, wherein the second guiding structure is a first guiding shaft, wherein the fourth groove is a second closed groove, and wherein the fourth guiding structure is a second guiding shaft.

3. The hinge mechanism of claim 1, wherein the first support arm comprises a first hollow zone, wherein at least a first part of the first guiding part is inserted into the first hollow zone, wherein the second support arm comprises a third hollow zone, and wherein at least a second part of the third guiding part is inserted into the third hollow zone.

4. The hinge mechanism of claim 1, wherein the first swing arm comprises a second hollow zone, wherein at least a first part of the second guiding part is inserted into the second hollow zone, wherein the second swing arm comprises a fourth hollow zone, and wherein at least a second part of the fourth guiding part is inserted into the fourth hollow zone.

5. The hinge mechanism of claim 1, wherein the first support plate further comprises a third plate surface, wherein the first plate surface is disposed back to back with the third plate surface, wherein the first guiding part and the second guiding part are disposed on the third plate surface, wherein the second support plate further comprises a fourth plate surface, wherein the second plate surface is disposed back to back with the fourth plate surface, and wherein the third guiding part and the fourth guiding part are disposed on the fourth plate surface.

6. The hinge mechanism of claim 5, wherein the second groove is a first straight groove, wherein when the hinge mechanism is in an unfolded state, in a fifth direction from the first plate surface to the third plate surface, the second groove extends in a sixth direction away from the base, wherein the fourth groove is a second straight groove, and wherein when the hinge mechanism is in the unfolded state, in a seventh direction from the second plate surface to the fourth plate surface, the second groove extends in an eighth direction away from the base.

7. The hinge mechanism of claim 1, wherein the first housing fastening bracket comprises a first rotation groove comprising a first groove surface, wherein the first support plate comprises a first rotation part disposed in the first rotation groove and configured to rotate along the first groove surface, wherein the second housing fastening bracket comprises a second rotation groove comprising a second groove surface, and wherein the second support plate comprises a second rotation part disposed in the second rotation groove and configured to rotate along the second groove surface.

8. The hinge mechanism of claim 1, wherein the first support plate is rotatably connected to the first housing fastening bracket by using a first pin, and wherein the second support plate is rotatably connected to the second housing fastening bracket by using a second pin.

9. The hinge mechanism of claim 1, wherein the base further comprises:

a first arc-shaped groove comprising a first arc-shaped surface; and a second arc-shaped groove comprising a second arc-shaped surface, wherein the first swing arm comprises a third end rotatably connected to the base and comprising a first arc-shaped rotation block, wherein the first arc-shaped rotation block is accommodated in the first arc-shaped groove and is configured to rotate along the first arc-shaped surface, wherein the second swing arm comprises a fourth end rotatably connected to the base and comprising a second arc-shaped rotation block, wherein the second arc-shaped rotation block is accommodated in the second arc-shaped groove and is configured to rotate along the second arc-shaped surface, wherein the first swing arm is rotatably connected to the first housing fastening bracket, and wherein the second swing arm is rotatably connected to the second housing fastening bracket.

10. An electronic device, comprising:

a flexible display comprising a bendable part;

a hinge mechanism disposed in correspondence with the bendable part and comprising:

a base comprising a bearing surface configured to support the flexible display;

a main shaft module comprising:

a first side;

a second side opposite the first side;

a first rotation assembly disposed on the first side and comprising:

a first housing fastening bracket;

a first support plate rotatably connected to the first housing fastening bracket and comprising:

a first plate surface configured to support the flexible display;

a first guiding part comprising a first groove;

a second guiding part comprising a second groove; and a first end proximate to the base;

a first support arm rotatably connected to the base, slidably connected to the first housing fastening bracket, and comprising:

a first guiding structure inserted into the first groove and configured to slide along the first groove; and a first axis of rotation; and a first swing arm rotatably connected to the base and comprising:

a second guiding structure inserted into the second groove and configured to slide along the second groove; and a second axis of rotation that is parallel to the first axis of rotation and that does not coincide with the first axis of rotation; and a second rotation assembly disposed on the second side and comprising:

a second housing fastening bracket;

a second support plate configured to support the flexible display and comprising:

a second plate surface configured to support the flexible display;

a third guiding part comprising a third groove;

a fourth guiding part comprising a fourth groove; and a second end proximate to the base;

a second support arm rotatably connected to the base, slidably connected to the second housing fastening bracket, and comprising:

a third guiding structure inserted into the third groove and configured to slide along the third groove; and a third axis of rotation; and a second swing arm rotatably connected to the base and comprising:

a fourth guiding structure inserted into the fourth groove and configured to slide along the fourth groove; and a fourth axis of rotation that is parallel to the third axis of rotation and that does not coincide with the third axis of rotation, wherein when the first housing fastening bracket and the second housing fastening bracket rotate toward each other, the first support arm and the first swing arm are configured to rotate around the base, the first guiding structure is configured to slide along the first groove, the second guiding structure is configured to slide along the second groove, the first support plate is configured to rotate relative to the first housing fastening bracket, the first end is configured to move in a first direction away from the base, the second support arm and the second swing arm are configured to rotate around the base, the third guiding structure is configured to slide along the third groove, the fourth guiding structure is configured to slide along the fourth groove, the second support plate is configured to rotate relative to the second housing fastening bracket, the second end is configured to move in a second direction away from the base to form, between the first plate surface, the second plate surface, and the bearing surface, a display accommodation space configured to accommodate the bendable part of the flexible display;

a third side; and a fourth side opposite the third side;

a first housing disposed on the third side and fastened to the first housing fastening bracket; and a second housing disposed on the fourth side and fastened to the second housing fastening bracket, wherein the flexible display continuously covers the first housing, the second housing, and the hinge mechanism, wherein the flexible display is fastened to the first housing and the second housing, and wherein the first groove comprises a first opening and a first groove wall, wherein the first opening is disposed in a third direction away from the base, wherein the first guiding structure comprises a first guiding surface configured to slide along the first groove wall, wherein the third groove comprises a second opening and a second groove wall, wherein the second opening is disposed in a fourth direction away from the base, and wherein the third guiding structure comprises a second guiding surface configured to slide along the second groove wall.

11. The electronic device of claim 10, wherein the second groove is a first closed groove, wherein the second guiding structure is a first guiding shaft, wherein the fourth groove is a second closed groove, and wherein the fourth guiding structure is a second guiding shaft.

12. The electronic device of claim 10, wherein the first support arm comprises a first hollow zone, wherein at least a first part of the first guiding part is inserted into the first hollow zone, wherein the second support arm comprises a third hollow zone, and wherein at least a second part of the third guiding part is inserted into the third hollow zone.

13. The electronic device of claim 10, wherein the first swing arm comprises a second hollow zone, wherein at least a first part of the second guiding part is inserted into the second hollow zone, wherein the second swing arm comprises a fourth hollow zone, and wherein at least a second part of the fourth guiding part is inserted into the fourth hollow zone.

14. The electronic device of claim 10, wherein the first support plate further comprises a third plate surface, wherein the first plate surface is disposed back to back with the third plate surface, wherein the first guiding part and the second guiding part are disposed on the third plate surface, wherein the second support plate further comprises a fourth plate surface, wherein the second plate surface is disposed back to back with the fourth plate surface, and wherein the third guiding part and the fourth guiding part are disposed on the fourth plate surface.

15. The electronic device of claim 14, wherein the second groove is a first straight groove, wherein when the hinge mechanism is in an unfolded state, in a fifth direction from the first plate surface to the third plate surface, the second groove extends in a sixth direction away from the base, wherein the fourth groove is a second straight groove, and wherein when the hinge mechanism is in the unfolded state, in a seventh direction from the second plate surface to the fourth plate surface, the second groove extends in an eighth direction away from the base.

16. The electronic device of claim 10, wherein the first housing fastening bracket comprises a first rotation groove comprising a first groove surface, wherein the first support plate comprises a first rotation part disposed in the first rotation groove and configured to rotate along the first groove surface, wherein the second housing fastening bracket comprises a second rotation groove comprising a second groove surface, and wherein the second support plate comprises a second rotation part disposed in the second rotation groove and configured to rotate along the second groove surface.

17. The electronic device of claim 10, wherein the first support plate is rotatably connected to the first housing fastening bracket by using a first pin, and wherein the second support plate is rotatably connected to the second housing fastening bracket by using a second pin.

18. The electronic device of claim 10, wherein the base further comprises:

a first arc-shaped groove comprising a first arc-shaped surface; and a second arc-shaped groove comprising a second arc-shaped surface, wherein the first swing arm comprises a third end rotatably connected to the base and comprising a first arc-shaped rotation block, wherein the first arc-shaped rotation block is accommodated in the first arc-shaped groove and is configured to rotate along the first arc-shaped surface, wherein the second swing arm comprises a fourth end rotatably connected to the base and comprising a second arc-shaped rotation block, wherein the second arc-shaped rotation block is accommodated in the second arc-shaped groove and is configured to rotate along the second arc-shaped surface, wherein the first swing arm is rotatably connected to the first housing fastening bracket, and wherein the second swing arm is rotatably connected to the second housing fastening bracket.

* * * * *